(12) United States Patent
Ookawa et al.

(10) Patent No.: US 10,088,617 B2
(45) Date of Patent: Oct. 2, 2018

(54) IMPRINT MOLD, IMPRINT METHOD, WIRE GRID POLARIZER, AND METHOD FOR MANUFACTURING WIRE GRID POLARIZER

(71) Applicant: DAI NIPPON PRINTING CO., LTD., Tokyo (JP)

(72) Inventors: Yasuhiro Ookawa, Tokyo (JP); Keita Iimura, Tokyo (JP); Naoko Nakata, Tokyo (JP)

(73) Assignee: DAI NIPPON PRINTING CO., LTD., Tokyo (JP)

( * ) Notice: Subject to any disclaimer, the term of this patent is extended or adjusted under 35 U.S.C. 154(b) by 0 days.

(21) Appl. No.: 15/501,629

(22) PCT Filed: Jul. 30, 2015

(86) PCT No.: PCT/JP2015/071599
§ 371 (c)(1),
(2) Date: Feb. 3, 2017

(87) PCT Pub. No.: WO2016/021475
PCT Pub. Date: Feb. 11, 2016

(65) Prior Publication Data
US 2017/0227696 A1      Aug. 10, 2017

(30) Foreign Application Priority Data

Aug. 4, 2014   (JP) .................................. 2014-158418

(51) Int. Cl.
*G02B 5/30*      (2006.01)
*G03F 7/00*      (2006.01)
(Continued)

(52) U.S. Cl.
CPC ........... *G02B 5/3058* (2013.01); *B05D 3/007* (2013.01); *B05D 3/06* (2013.01); *B05D 3/12* (2013.01);
(Continued)

(58) Field of Classification Search
CPC ........ G02B 5/3058; B05D 3/007; B05D 3/06; B05D 3/12; B29D 11/00644; G03F 7/0002
(Continued)

(56) References Cited

U.S. PATENT DOCUMENTS

2006/0210714 A1 *  9/2006  Huizinga ............ B29C 35/0888
                                                     427/359
2006/0279004 A1 * 12/2006  Suehira .................. B82Y 10/00
                                                     257/797
(Continued)

FOREIGN PATENT DOCUMENTS

JP      2001-274073 A      10/2001
JP      2003-066229 A       3/2003
(Continued)

OTHER PUBLICATIONS

Jul. 26, 2016 Office Action issued in Japanese Patent Application No. 2014-158415.
(Continued)

*Primary Examiner* — Frank Font
(74) *Attorney, Agent, or Firm* — Oliff PLC

(57) ABSTRACT

A configuration including a main pattern region and a measurement pattern region which are set on one surface of a substrate having flexibility, wherein the measurement pattern region has at least a region disposed inside the contour line of the main pattern region, a main pattern, in which a plurality of line-shaped main convex patterns are arrayed with desired intervals, is disposed in the main (Continued)

pattern region, a measurement pattern, in which a plurality of line-shaped unit convex patterns are arrayed with desired intervals, is disposed in the measurement pattern region, and the line direction of the main pattern and the line direction of the measurement pattern are the same.

14 Claims, 19 Drawing Sheets

(51) Int. Cl.
    *B05D 3/00*     (2006.01)
    *B29D 11/00*     (2006.01)
    *B05D 3/12*     (2006.01)
    *B05D 3/06*     (2006.01)

(52) U.S. Cl.
    CPC ...... *B29D 11/00644* (2013.01); *G03F 7/0002* (2013.01)

(58) Field of Classification Search
    USPC ....... 359/485.05, 487.03, 900; 427/256, 286, 427/287
    See application file for complete search history.

(56) References Cited

U.S. PATENT DOCUMENTS

| | | | |
|---|---|---|---|
| 2007/0009572 A1* | 1/2007 | Chan | B29C 33/3857 424/426 |
| 2007/0035056 A1* | 2/2007 | Suehira | B29C 35/0288 264/40.1 |
| 2009/0068497 A1* | 3/2009 | Ichikawa | G11B 5/855 428/800 |
| 2010/0256796 A1* | 10/2010 | Nara | G01N 21/95607 700/110 |
| 2015/0064057 A1* | 3/2015 | Grigoropoulos | C23C 18/14 420/441 |
| 2015/0064628 A1* | 3/2015 | Guo | G03F 7/30 430/316 |
| 2015/0156886 A1* | 6/2015 | Wang | G03F 7/0002 174/253 |
| 2015/0253660 A1* | 9/2015 | Ojima | G03F 1/76 216/41 |

FOREIGN PATENT DOCUMENTS

| | | |
|---|---|---|
| JP | 2006-100619 A | 4/2006 |
| JP | 2006-215230 A | 8/2006 |
| JP | 2007-035768 A | 2/2007 |
| JP | 2008-145581 A | 6/2008 |
| JP | 2009-262546 A | 11/2009 |
| JP | 2009-265290 A | 11/2009 |
| JP | 2010-278041 A | 12/2010 |
| JP | 2011-061025 A | 3/2011 |
| JP | 2011-108887 A | 6/2011 |
| JP | 2011-176132 A | 9/2011 |
| JP | 2012-104697 A | 5/2012 |
| JP | 2012-114158 A | 6/2012 |
| JP | 2012-203294 A | 10/2012 |
| WO | 2008142958 A1 | 11/2008 |
| WO | 2013126750 A1 | 8/2013 |

OTHER PUBLICATIONS

Apr. 12, 2016 Office Action issued in Japanese Patent Application No. 2014-158418.
May 31, 2016 Office Action issued in Japanese Patent Application No. 2014-158418.
Sep. 15, 2015 Search Report issued in International Application No. PCT/JP2015/071599.
Feb. 7, 2017 Preliminary Report on Patentability issued in International Application No. PCT/JP2015/071599.

\* cited by examiner

IMPRINT MOLD, IMPRINT METHOD, WIRE GRID POLARIZER, AND METHOD FOR MANUFACTURING WIRE GRID POLARIZER

TECHNICAL FIELD

The present invention relates to an imprint mold, particularly an imprint mold having flexibility, an imprint method using this mold, a wire grid polarizer, and a method for manufacturing the wire grid polarizer.

BACKGROUND ART

A pattern forming technique using an imprint method is currently receiving attention as a micro pattern forming technique that is used in place of a photolithographic technique. The imprint method is a pattern forming technique that transfers a micro relief structure to a molding resin using a mold having a micro relief structure, whereby the micro structure is transferred in actual size. For example, in the case of an imprint method using a photosetting resin composition as the molding resin, droplets of the photosetting resin composition are supplied to the surface of the transfer substrate, and the photosetting resin composition is filled into the desired relief structure by bringing the mold having the relief structure and the transfer substrate close together at a predetermined distance, and the resin layer is formed by irradiating light from a mold side in this state so as to harden the photosetting resin composition, then the mold is separated from the resin layer, whereby the pattern structure having the relief structure (relief pattern), in which concave/convex portions of the mold are inverted, is formed. Further, using this pattern structure as an etching resist, the transfer substrate is etched.

In the case of this imprint method, the positional coordinates and design coordinates of the pattern to be formed may shift due to an error generated during imprinting. Therefore, the relief structure (main pattern) to form a target pattern and a measurement pattern are set in advance, and the measurement pattern, which is formed together with the main pattern by imprinting, is measured, so that the magnitude and direction of the shift are detected, and the shift of the formed position of the main pattern is corrected (PTL 1, PTL 2).

Recently, a wire grid polarizer, which has a plurality of micro metal wires disposed in parallel, is used for photo-alignment processing or the like (PTL 3). For example, a polarizing element unit is configured by arraying a plurality of wire grid polarizers in a holding frame, so as to align the micro metal wires in one direction, and photo-alignment processing is performed with anisotropy, by irradiating ultraviolet rays to the polarizing element unit and irradiating the emitting linearly polarized light onto a curable resin composition (PTL 4). Optical elements are used for various purposes other than photo-alignment processing, such as for a member to improve the brightness of a display, and use of the imprint mold is under consideration to fabricate such optical elements as well.

CITATION LIST

Patent Literature

[PTL 1] Japanese Patent Application Laid-open No. 2010-278041
[PTL 2] Japanese Patent Application Laid-open No. 2011-61025
[PTL 3] Japanese Patent Application Laid-open No. 2009-265290
[PTL 4] Japanese Patent Application Laid-open No. 2012-203294

SUMMARY OF INVENTION

Technical Problem

In the case of an imprint which uses a mold that has no flexibility, it is demanded that the mold and the transfer substrate be maintained as parallel to each other so that a residual film thickness in a resin layer, after being separated from the mold, becomes uniform. Further, in the case of a mold that has no flexibility, the mold is subject to strong peeling stress during separation from the resin layer as the surface area of the mold increases, which makes it difficult to separate the mold without causing defects in the pattern. As a result, in the case of the imprint mold that has no flexibility, there is a limit to increase the surface area of the imprint mold.

On the other hand, as an imprint method, a roller imprint is known, which is a method of creating a mold by forming a micro relief structure on a substrate having flexibility, allowing the mold to contact the resin composition by pressing the rear surface of the mold (surface on which the relief structure is not formed) using a roller, hardening the resin composition after contacting, then separating the hardened resin layer from the mold. In the case of the roller imprint, the surface area of the mold can easily be increased, compared with the imprint method using a mold that has no flexibility. However, a problem is that the pattern more easily deforms since the mold contacts with the resin composition by being pressed with a roller. Further, if the mold used for the roller imprint has a measurement pattern, which accompanies the main pattern to be formed, the measurement pattern also easily deforms, which makes it difficult to perform a desired measurement.

In manufacturing a wire grid polarizer using the imprint mold, a wire grid polarizer having a larger surface area can be manufactured if the roller imprint is used, compared with using a mold that has no flexibility. However, in the case of configuring a polarizing element unit by arraying a plurality of wire grid polarizers in a holding frame, aligning the micro metal in one direction, each of the wire grid polarizers has a respective difference, and a polarizing axis shifts from one another. Therefore, the polarizing axes must be aligned by aligning the positions of the individual wire grid polarizers. This positional alignment can be performed using a measurement pattern, for example, but if the measurement pattern is located in the main pattern region where micro metal wires are formed, linearly polarized light cannot be acquired in an area where the measurement pattern exists, and photo-alignment processing cannot be performed smoothly. If the measurement pattern, where linearly polarized light cannot be acquired, is disposed outside the main pattern where the micro metal wires are formed in order to solve the above problem, then the measurement pattern and the main pattern become distanced, and accurate positional alignment becomes difficult and/or an effective polarizing region decreases in a wire grid polarizer. Furthermore, as mentioned above, in the case of a roller imprint, the measurement pattern also more easily deforms, and the positional alignment accuracy of the wire grid polarizers decreases.

With the foregoing in view, it is an object of the present invention to provide an imprint mold which allows using a roller imprint, with suppressing the generation of defects, an imprint method using this mold, a wire grid polarizer of which position can be aligned at high precision, and a method for manufacturing this wire grid polarizer.

Solution to Problem

To achieve this object, an imprint mold of the present invention has: a substrate having flexibility; and a main pattern region and a measurement pattern region which are set on one surface of the substrate, wherein a main pattern, in which a plurality of line-shaped main convex patterns or main concave patterns are arrayed with desired intervals, is disposed in the main pattern region, a measurement pattern, in which a plurality of line-shaped unit convex patterns or unit concave patterns are arrayed with desired intervals, is disposed in the measurement pattern region, and the line direction of the main pattern and the line direction of the measurement pattern are the same.

In another aspect of the present invention, the line width of the line-shaped main convex pattern or main concave pattern constituting the main pattern and the line width of the line-shaped unit convex pattern or unit concave pattern constituting the measurement pattern are the same.

In another aspect of the present invention, the measurement pattern region has at least a region disposed inside the contour line of the main pattern region.

In another aspect of the present invention, the measurement pattern includes a part that can be observed by an observing unit.

In another aspect of the present invention, the distance between the main pattern region and the measurement pattern region is 100 µm or less.

In another aspect of the present invention, a positional shift between the center line of the line-shaped unit convex pattern or unit concave pattern constituting the measurement pattern and the center line of the line-shaped main convex pattern or main concave pattern constituting the main pattern disposed on extension of the center line the center line of the line-shaped unit convex pattern or unit concave pattern constituting the measurement pattern is less than half of the line width of the line-shaped unit convex pattern or unit concave pattern constituting the measurement pattern.

In another aspect of the present invention, the substrate is a resin film.

An imprint method of the present invention has: a pressure bonding step of bonding a surface on one side of a flexible imprint mold, the surface being provided with a relief structure, to a molding resin layer disposed on one surface of a transfer substrate, by pressuring from a surface, on which the relief structure is not formed, using a roller; a hardening step of forming a transferred resin layer, to which the relief structure is transferred, by hardening the molding resin layer that is pressure-bonded to the imprint mold; and a separating step of disposing a pattern structure, which is the transferred resin layer, onto the transfer substrate, by separating the transferred resin layer and the imprint mold, wherein as the imprint mold, the above mentioned imprint mold of the present invention is used, and the imprint mold is pressure-bonded to the molding resin layer in the line direction of the main pattern of the imprint mold in the pressure bonding step.

In another aspect of the present invention, the transferred resin layer and the imprint mold are separated in the line direction of the main pattern of the imprint mold in the separating step.

A wire grid polarizer of the present invention has: a transparent substrate; a wire grid material layer which is disposed on one surface of the transparent substrate; and a wire grid region and a measurement pattern region which are set on the wire grid material layer, wherein a wire grid, in which a plurality of line-shaped main openings are arrayed with desired intervals, is disposed in the wire grid region of the wire grid material layer, a measurement pattern, in which a plurality of line-shaped unit openings are arrayed with desired intervals, is disposed in the measurement pattern region of the wire grid material layer, and the line direction of each of the main openings and the line direction of each of the unit openings are the same, and the line width of each of the main openings and the line width of each of the unit openings are the same.

In another aspect of the present invention, the measurement pattern region has at least a region disposed inside the contour line of the wire grid region.

In another aspect of the present invention, the measurement pattern includes a part that can be observed by an observing unit.

In another aspect of the present invention, the distance between the wire grid region and the measurement pattern region is 100 µm or less.

In another aspect of the present invention, the positional shift between the center line of each of the unit openings and the center line of each of the main openings disposed on extension of the center line of each of the unit openings is less than half of the line width of each of the unit openings.

A method for manufacturing a wire grid polarizer of the present invention has: a pressure-bonding step of bonding a surface on one side of a flexible imprint mold, the surface being provided with a relief structure, to an etching resist layer disposed on a wire grid material layer of a transparent substrate, which has the wire grid material layer on one surface thereof, by pressuring from a surface of the imprint mold, on which the relief structure is not formed, using a roller; a hardening step of forming a resist pattern layer, to which the relief structure is transferred, by hardening the etching resist layer that is pressure-bonded to the imprint mold; a separating step of separating the resist pattern layer and the imprint mold; and an etching step of forming line-shaped main openings constituting a wire grid and line-shaped unit openings constituting a measurement pattern by etching the wire grid material layer using the resist pattern layer as an etching mask. The imprint mold used here is an imprint mold including: a substrate having flexibility; and a main pattern region and a measurement pattern region which are set on one surface of the substrate, wherein a main pattern, in which a plurality of line-shaped main convex patterns are arrayed with desired intervals, is disposed in the main pattern region, a measurement pattern, in which a plurality of line-shaped unit convex patterns are arrayed with desired intervals, is disposed in the measurement pattern region, and the line direction of the main pattern and the line direction of the measurement pattern are the same, and the line width of the line-shaped main convex pattern constituting the main pattern and the line width of the line-shaped unit convex pattern constituting the measurement pattern are the same. The imprint mold is pressure-bonded to the etching resist layer in the line direction of the main pattern of the imprint mold in the pressure-bonding step, and the resist pattern layer and the imprint mold are separated in the line direction of the main pattern of the imprint mold in the separating step.

Advantageous Effects of Invention

According to the imprint mold of the present invention, deformation of the pattern can be suppressed in the roller imprint, and according to the imprint method of the present invention, a roller imprint with suppressing the generation of defects can be implemented.

Further, according to the wire grid polarizer of the present invention, a plurality of wire grid polarizers can be aligned at high precision, and good photo-alignment processing with suppressing shift of the polarizing axes can be performed, and according to the method for manufacturing the wire grid polarizer of the present invention, this wire grid polarizer can be easily manufactured.

DESCRIPTION OF EMBODIMENTS

Figure 1:
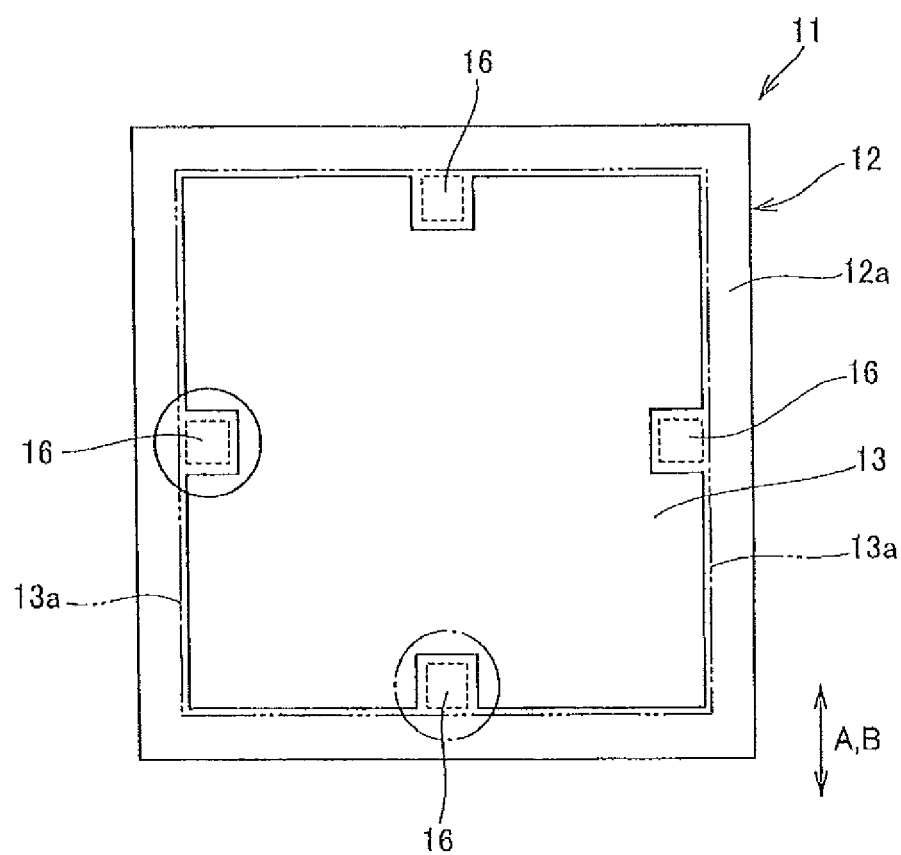
FIG. 1 is a plan view depicting an embodiment of an imprint mold of the present invention.

Embodiments of the present invention will be described with reference to the drawings.

The drawings are either a schematic or conceptual drawings, and the dimensions of each member, the ratio of the sizes of the members and the like are not necessarily the same as actual values, and these dimensions and ratios thereof of members may differ depending on the drawing, even if the same members are drawn.

[Imprint Mold]

Figure 2:
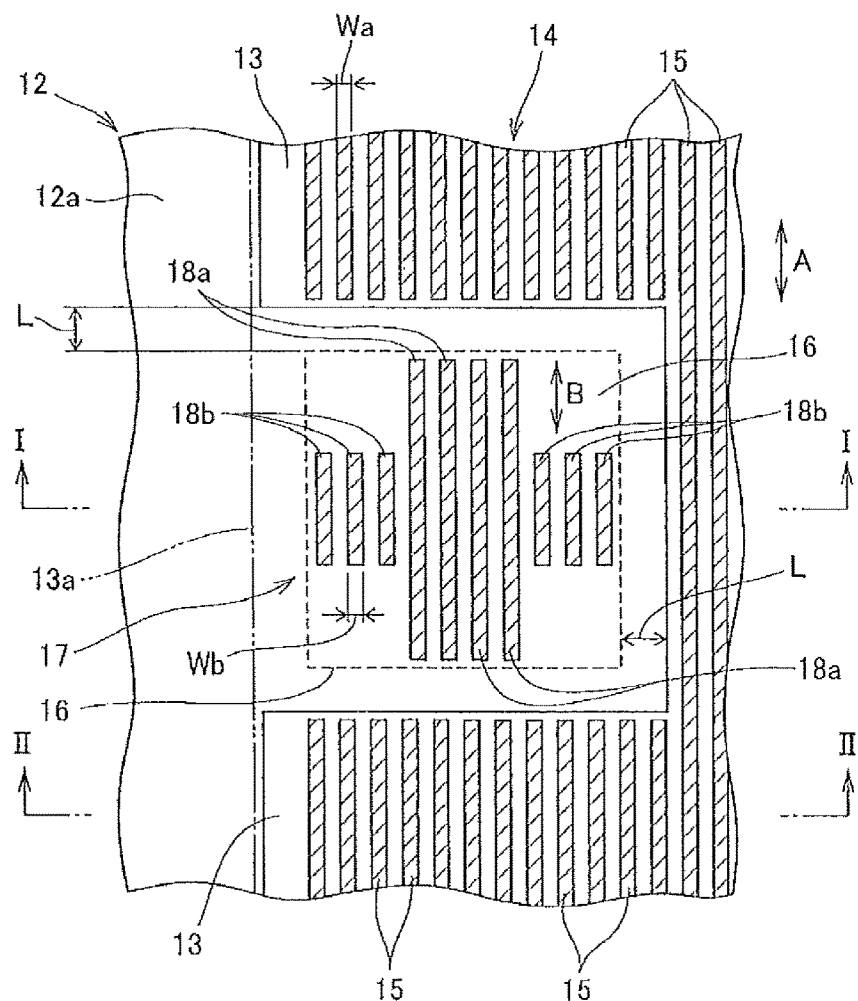
FIG. 2 is an enlarged plan view of a part enclosed by a solid line circle in the imprint mold in FIG. 1.
Figure 3:
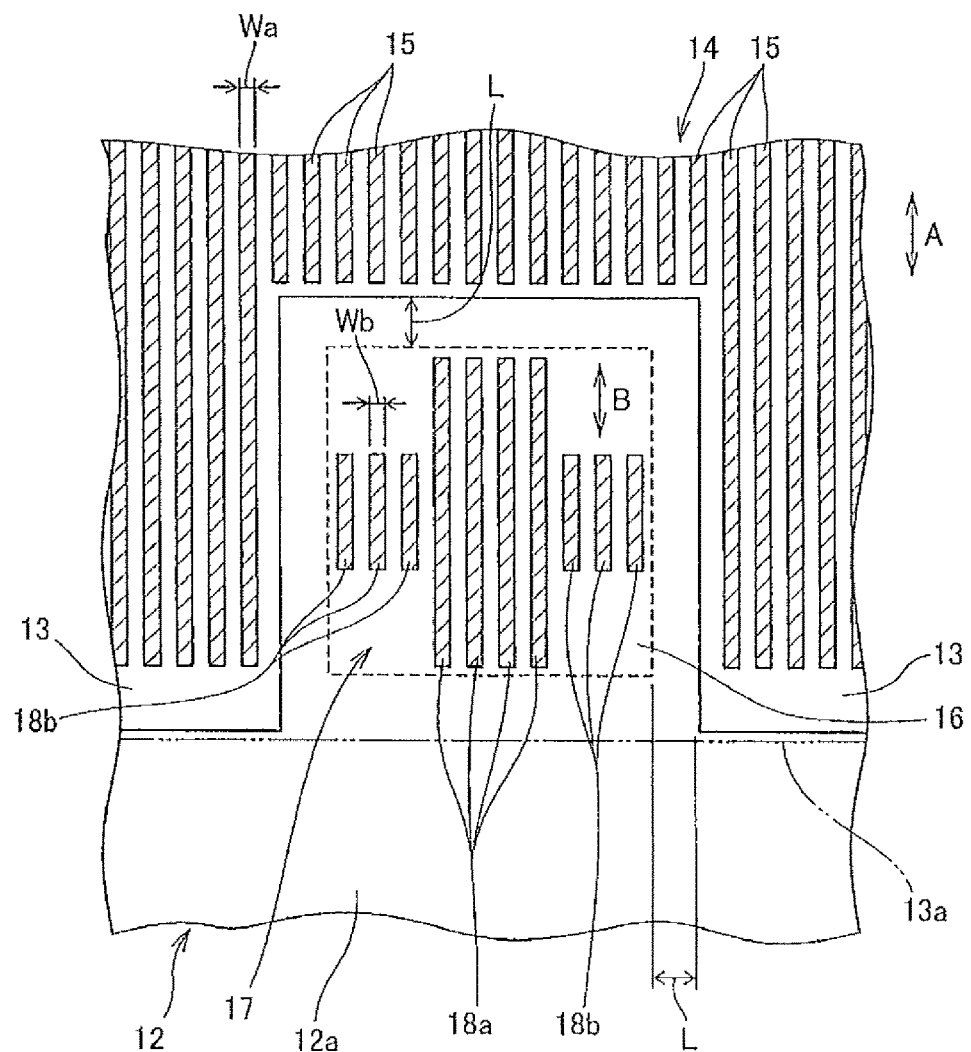
FIG. 3 is an enlarged plan view of a part enclosed by a dashed line circle in the imprint mold in FIG. 1.
Figure 4:
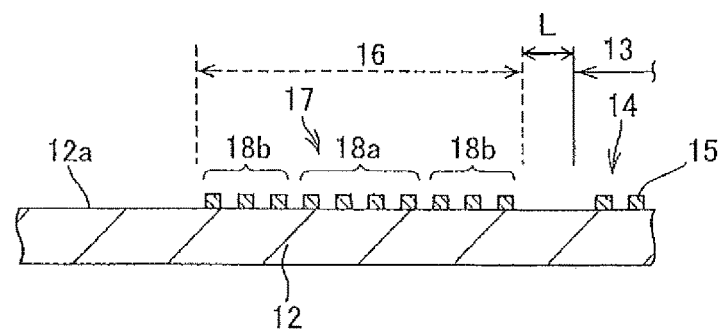
FIG. 4 is a longitudinal sectional view at the I-I line in the imprint mold in FIG. 2.
Figure 5:
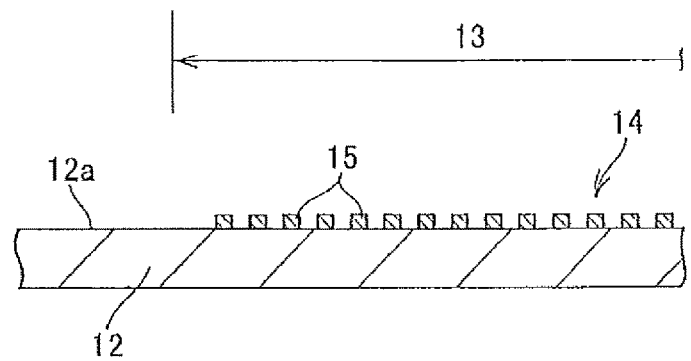
FIG. 5 is a longitudinal sectional view at the II-II line in the imprint mold in FIG. 2.

FIG. 1 is a plan view depicting an embodiment of an imprint mold of the present invention, FIG. 2 is an enlarged plan view of a part enclosed by a solid line circle in the imprint mold in FIG. 1, and FIG. 3 is an enlarged plan view of a part enclosed by a dashed line circle in the imprint mold in FIG. 1. FIG. 4 is a longitudinal sectional view at the I-I line in the imprint mold in FIG. 2, and FIG. 5 is a longitudinal sectional view at the II-II line in the imprint mold in FIG. 2.

In FIG. 1 to FIG. 5, the imprint mold 11 has a substrate 12 having flexibility, and a main pattern region 13 and four measurement pattern regions 16 which are set on one surface 12a of the substrate 12. In the illustrated example, the main pattern region 13 is enclosed by the solid line, and the measurement pattern region 16 is enclosed by the dashed line. As illustrated in FIG. 1, the main pattern region 13 has a rectangular contour, and a concave region is disposed in each side of the rectangle. The measurement pattern region 16 is disposed in each of the concave regions disposed in the main pattern region 13, and in the illustrated example, the entire region of the measurement pattern region 16 is disposed inside the contour line 13a of the main pattern region 13, but a part of the measurement pattern region 16 may be disposed inside the contour line 13a of the main pattern region 13. In the illustrated example, the contour line 13a of the main pattern region 13 is indicated by a two-dot chain line.

Figure 7:
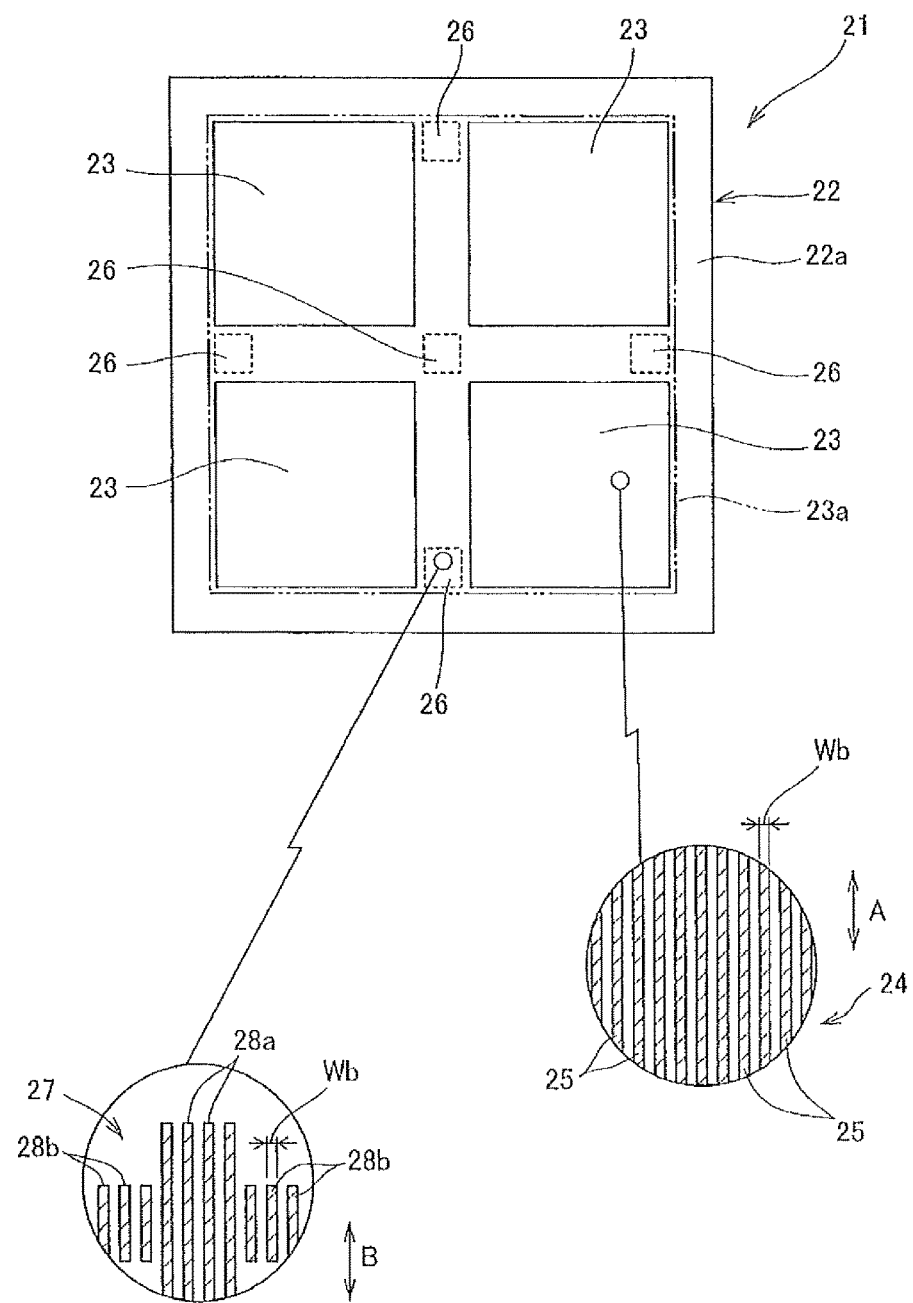
FIG. 7 is a plan view depicting another embodiment of the imprint mold of the present invention.

Here the contour line of the main pattern region is a line enclosing the outside of the main pattern region, and if the concave regions for setting the measurement pattern regions 16 exist in the main pattern region 13, as illustrated, the line enclosing the outside of the main pattern region, so as to include these concave regions, is the contour line. If a plurality of main pattern regions are set close to each other, as illustrated in FIG. 7, which will be described later, the line enclosing the outside of the plurality of main pattern regions, so as to include the main pattern regions, is the contour line. In the illustrated example, the contour line 13a is indicated slightly distant from the main pattern region 13, so that the periphery of the main pattern region 13 and the contour line 13a can be easily distinguished. This is the same for the other embodiments described herein below.

In the main pattern region 13 which is set on one surface 12a of the substrate 12, a main pattern 14 constituted by a plurality of line-shaped main convex patterns 15, which are arrayed with predetermined intervals, is disposed. In FIG. 2 and FIG. 3, the main convex patterns 15 are indicated by hatched lines. In the illustrated example, the line-shaped main convex patterns 15 are formed in the entire main pattern region 13 in the direction indicated by the arrow mark A. The line width Wa of each line-shaped main convex pattern 15 (see FIG. 2 and FIG. 3) can be appropriately set depending on the intended use of the imprint mold 11, and the width of the interval between the main convex patterns 15 can also be appropriately set. In FIG. 1, the main convex patterns 15 and the later mentioned unit convex patterns 18a and 18b are omitted.

In each measurement pattern region 16 which is set on one surface 12a of the substrate 12, a measurement pattern 17, constituted by a plurality of line-shaped unit convex patterns 18a and 18b arrayed with desired intervals, is disposed. In FIG. 2 and FIG. 3, the unit convex patterns 18a and 18b are indicated by hatched lines. In the illustrated example, a plurality of line-shaped unit convex patterns 18a are arrayed with desired intervals in the direction indicated by the arrow mark B, a plurality of line-shaped unit convex patterns 18b are arrayed with desired intervals in the direction indicated by the arrow mark B, and these two types of unit convex patterns form the cross-shaped measurement pattern 17. The line width Wb of each line-shaped unit convex pattern 18a and 18b (see FIG. 2 and FIG. 3) can be appropriately set depending on the intended use of the imprint mold 11, and the width of the intervals between the unit convex patterns 18a and 18b can also be appropriately set. In this way, the measurement pattern 17 constituted by the line-shaped unit convex patterns 18a and 18b includes a part which can be observed by an observation unit. For example, in the case when the observation unit is an optical microscope, a part or all of the measurement pattern 17 constituted by a plurality of unit convex patterns 18a or a plurality of unit convex patterns 18b can be observed by the optical microscope, even if individual unit convex pattern 18a or unit convex pattern 18b cannot be observed by the optical microscope. Examples of the observation unit, other than an optical microscope, are a fluorescent microscope, a laser microscope, a Raman microscope or the like.

As described above, the height of the main convex patterns 15 constituting the main pattern 14 and the height of the unit convex patterns 18a and 18b constituting the measurement pattern 17 in the imprint mold 11 can be set in accordance with the intended use of the imprint mold 11, the strength of the substrate 12 and the like. For example, these heights can be set so that the ratio of the height of the line-shaped main convex pattern 15, with respect to the line width Wa of the main convex pattern 15 (aspect ratio of the main convex pattern 15), and the ratio of the height of each line-shaped unit convex pattern 18a and 18b, with respect to the line width Wb of each unit convex pattern 18a and 18b (aspect ratio of the unit convex pattern 18a and 18b) become 10 or less.

In the present invention, the line direction of the main convex patterns 15 constituting the main pattern 14 disposed in the main pattern region 13 (direction indicated by the arrow mark A) and the line direction of the unit convex patterns 18a and 18b constituting the measurement pattern 17 disposed in the measurement pattern region 16 (direction indicated by the arrow mark B) are the same. Therefore, in the imprint mold 11, deformation of the main pattern 14 and the measurement pattern 17 in the roller imprint can be suppressed. Further, deformation of a created pattern during separation of the transferred resin layer and the mold in the roller imprint can be suppressed, and the pattern can be formed at high precision. As a result, error measurement, alignment and the like of the main pattern formed by the roller imprint can be performed at high precision using the measurement pattern. Here "the line direction of the main convex patterns 15 constituting the main pattern 14 and the line direction of the unit convex patterns 18a and 18b constituting the measurement pattern 17 are the same" means that the difference of these line directions is 5° or less, and this is the same for the description of the other embodiments herein below.

In the present invention, it is preferable that the line width Wa of the line-shaped main convex pattern 15 and the line width Wb of each line-shaped unit convex pattern 18a and 18b are the same. Then, for example, when a wire grid polarizer is manufactured using the imprint mold 11, the wire grid polarizer, in which the same linearly polarized light can be acquired in the main pattern 14 and in the measurement pattern 17, can be manufactured. Here "the line width Wa of the main convex pattern 15 and the line width Wb of each unit convex pattern 18a and 18b are the same" means that the difference of these line widths is 5 nm or less, and this is the same for the description of the other embodiments herein below.

In the present invention, it is preferable that the center line of each unit convex pattern 18a and 18b (line in the direction indicated by the arrow mark B in FIG. 2 and FIG. 3) constituting the measurement pattern 17 matches with the center line of the main convex pattern 15 constituting the main pattern 14 disposed on the extension of the above center line (line in the direction indicated by the arrow mark A in FIG. 2 and FIG. 3), and the positional shift of these center lines in the case of not matching is preferably less than half of the line width Wb of each unit convex pattern 18a and 18b constituting the measurement pattern 17. Then when a wire grid polarizer is manufactured using the imprint mold 11, the wire grid polarizer, in which the same linearly polarized light is acquired in the measurement pattern 17 and the main pattern 14 without a shift of polarizing axes, can be manufactured.

In the above-mentioned imprint mold 11, the distance L between the main pattern region 13 and the measurement pattern region 16 (see FIG. 2 to FIG. 4) can be 100 μm or less, preferably 30 μm or less. If the distance L between the main pattern region 13 and the measurement pattern region 16 exceeds 100 μm, the area of the main pattern region 13 decreases, which is not desirable.

The imprint mold of the present invention may have line-shaped main concave patterns instead of the line-shaped main convex patterns 15, and may have line-shaped unit concave patterns instead of the line-shaped unit convex patterns 18a and 18b. In other words, the main pattern region 13 may include a main pattern, in which a plurality of line-shaped main concave patterns are arrayed with desired intervals, and the measurement pattern region 16 may include a measurement pattern, in which a plurality of line-shaped unit concave patterns are arrayed with desired intervals.

Figure 6:
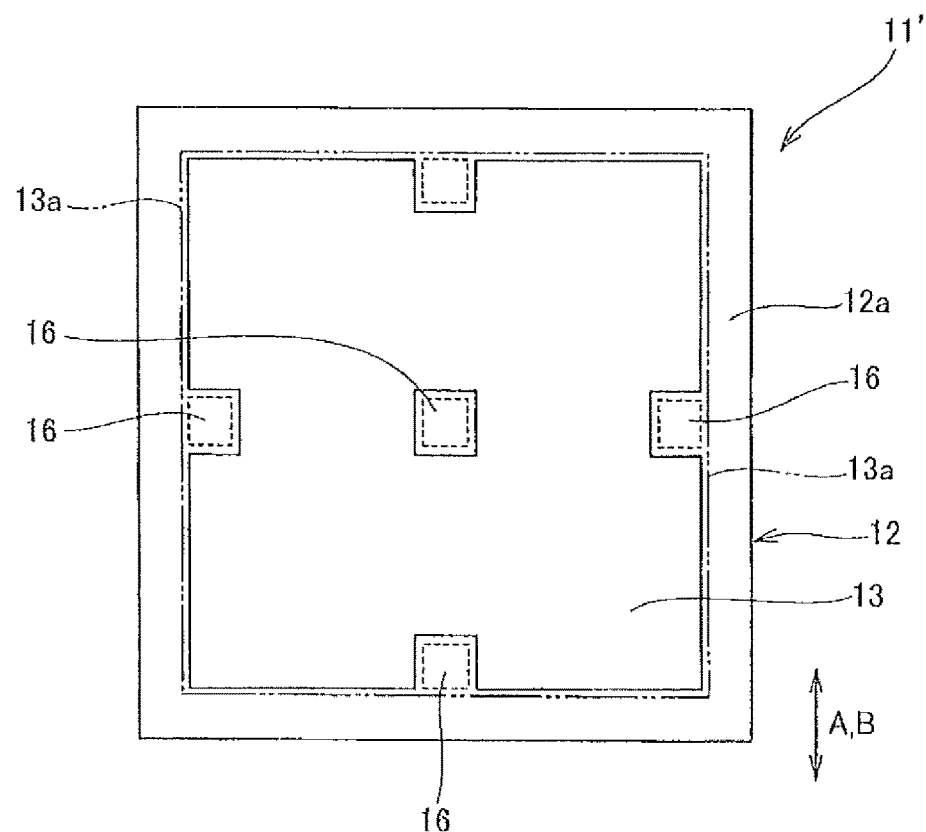
FIG. 6 is a plan view depicting another embodiment of the imprint mold of the present invention.

In the above-mentioned imprint mold 11, the measurement pattern region 16 is disposed in a concave region which is disposed in each side of the main pattern region 13 having a rectangular contour, but, as shown in FIG. 6, the imprint mold 11', in which the measurement pattern region 16 is also disposed in the center part of the main pattern region 13, may be used. The positions and number of measurement pattern regions 16 disposed in a region inside the main pattern region 13 are not limited to those illustrated in FIG. 6.

In the imprint mold of the present invention, a plurality of main pattern regions may be set close to one another. FIG. 7 is a plan view depicting an example of such an imprint mold. In FIG. 7, the imprint mold 21 has a substrate 22 having flexibility, main pattern regions 23 which are set at four locations on one surface 22a of the substrate 22, and five measurement pattern regions 26 which are set in a space between each main pattern region. In the illustrated example, the main pattern region 23 is enclosed by the solid line, and the measurement pattern region 26 is enclosed by the dashed line. As illustrated in FIG. 7, in the case when four main pattern regions are set close to one another, a contour line 23a (indicated by the two-dot chain line) is the line enclosing the outside of each main pattern region so as to include these main pattern regions 23. In this imprint mold 21, the measurement pattern regions 26 are disposed inside the contour line 23a, which is drawn to include the four main pattern regions 23.

In each main pattern region 23 which are set on one surface 22a of the substrate 22, a main pattern 24, constituted by a plurality of line-shaped main convex patterns 25, which are arrayed with desired intervals, is disposed. In the illustrated example, the line-shaped main convex patterns 25 are disposed in the direction indicated by the arrow mark A in the four main pattern regions 23 respectively. In each of the five measurement pattern regions 26, a measurement pattern 27, in which a plurality of line-shaped unit convex patterns 28a and 28b are arrayed with desired intervals, is disposed. In the illustrated example, the measurement pattern 27 is constituted by two types of unit convex patterns: line-shaped unit convex patterns 28a which is disposed in a direction indicated by the arrow mark B: and line-shaped unit convex patterns 28b also disposed in a direction indicated by the arrow B, whereby the contour of the measurement pattern 27 becomes cross-shaped. In FIG. 7, the main convex patterns 25 and the unit convex patterns 28a and 28b are omitted, and a part of the main pattern region 23 and a part of the measurement pattern region 26 are separately illustrated as enlarged plan views, in which the main convex patterns 25 and the unit convex patterns 28a and 28b are indicated by the hatched lines.

In this imprint mold 21 as well, the line direction of the main convex patterns 25 constituting the main pattern 24 disposed in the main pattern region 23 (direction indicated by the arrow mark A), and the line direction of the unit convex patterns 28a or 28b constituting the measurement pattern 27 disposed in the measurement pattern region 26 (direction indicated by the arrow mark B), are the same. The line width of the line-shaped main convex pattern 25 and the line width of the line-shaped unit convex pattern 28a and 28b may be the same. Further, the distance between the main pattern region 23 and the measurement pattern region 26 can be 100 µm or less, preferably 30 µm or less.

Figure 8:
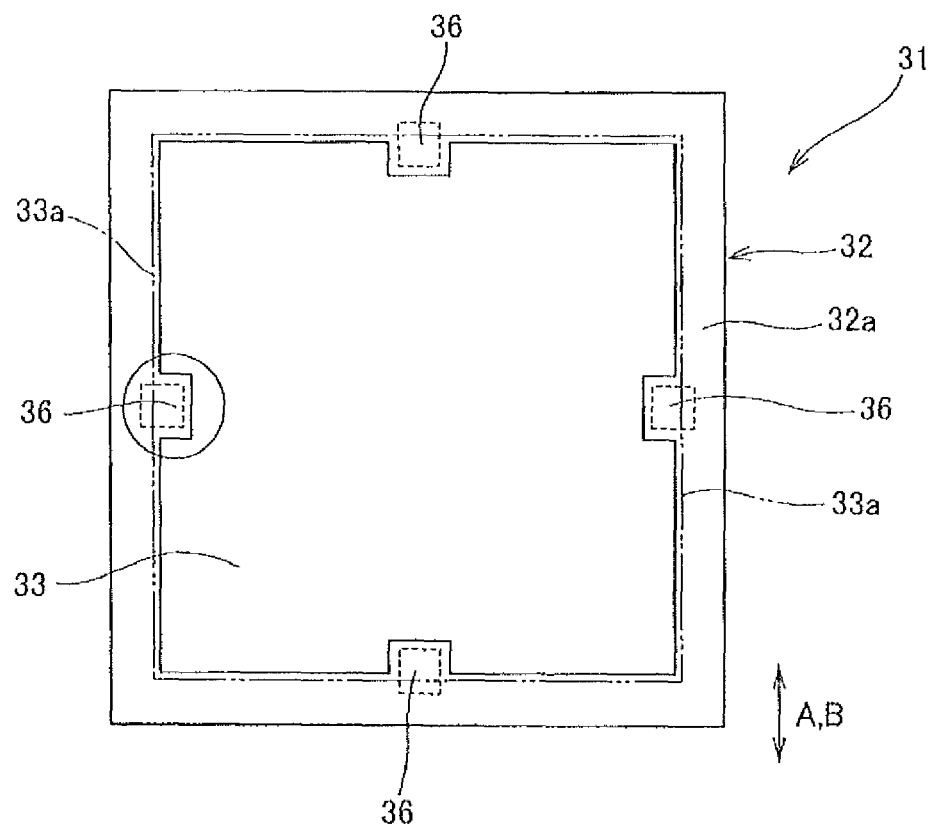
FIG. 8 is a plan view depicting another embodiment of the imprint mold of the present invention.
Figure 9:
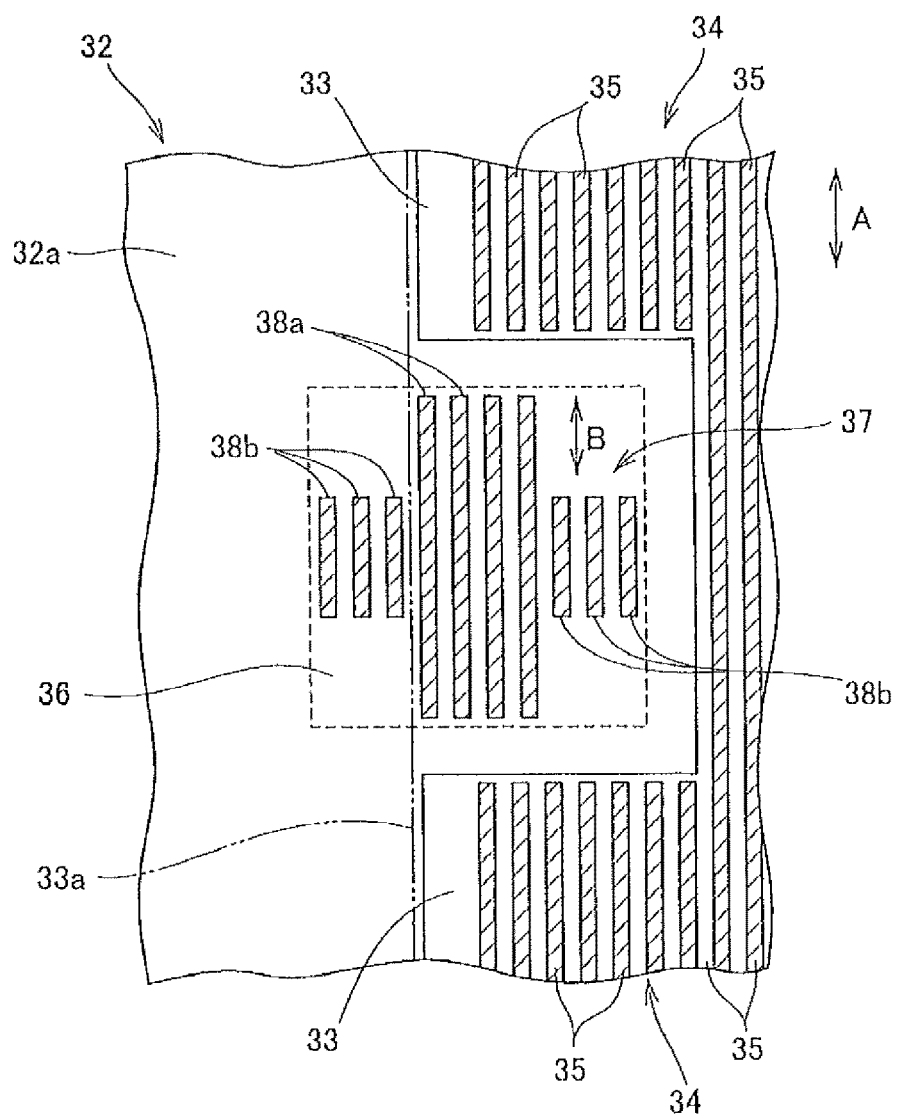
FIG. 9 is an enlarged plan view of a part enclosed by a solid line circle in the imprint mold in FIG. 8.

FIG. 8 is a plan view depicting another embodiment of the imprint mold of the present invention, and FIG. 9 is an enlarged plan view of the part enclosed by the solid line circle in the imprint mold in FIG. 8. In FIG. 8 and FIG. 9, the imprint mold 31 has a substrate 32 having flexibility, and a main pattern region 33 and four measurement pattern regions 36 which are set on one surface 32a of the substrate 32. In the illustrated example, the main pattern region 33 is enclosed by the solid line, and the measurement pattern region 36 is enclosed by the dashed line. As illustrated in FIG. 8, the main pattern region 33 has a rectangular contour, and a concave region is disposed in each side of the rectangle. The measurement pattern region 36 is disposed in each concave region of which a partial region belongs to the main pattern region 33. Therefore, the other region of the measurement pattern region 36 is disposed outside the contour line 33a (indicated by the two-dot chain line) of the main pattern region 33, which is different from the imprint mold 11 mentioned above.

In the main pattern region 33 which is set on one surface 32a of the substrate 32, a main pattern 34 constituted by a plurality of line-shaped main convex patterns 35, which are arrayed with predetermined intervals, is disposed. As illustrated in FIG. 9, the line-shaped main convex patterns 35 are formed in the entire main pattern region 33 in the direction indicated by the arrow mark A. Further, in each of the four measurement pattern regions 36, a measurement pattern 37, constituted by a plurality of line-shaped unit convex patterns 38a and 38b, which are arrayed with desired intervals, is disposed. As illustrated in FIG. 9, the measurement pattern 37 is constituted by two types of unit convex patterns: line-shaped unit convex patterns 38a, which are disposed in a direction indicated by the arrow mark B; and line-shaped unit convex patterns 38b which are also disposed in the direction indicated by the arrow B, whereby the contour of the measurement pattern 37 becomes cross-shaped. In FIG. 8, the main convex patterns 35 and the unit convex patterns 38a and 38b are omitted. In FIG. 9, the main convex patterns 35 and the unit convex patterns 38a and 38b are indicated by the hatched lines.

In this imprint mold 31 as well, the line direction of the main convex patterns 35, constituting the main pattern 34 disposed in the main pattern region 33 (direction indicated by the arrow mark A), and the line direction of the unit convex patterns 38a and 38b, constituting the measurement pattern 37 disposed in the measurement pattern region 36 (direction indicated by the arrow mark B), are the same. The line width of the line-shaped main convex pattern 35 and the line width of the line-shaped unit convex pattern 38a or 38b may be the same. Further, the distance between the main pattern region 33 and the measurement pattern region 36 can be 100 µm or less, preferably 30 µm or less.

For the substrates 12, 22 and 32 that constitute the imprint molds 11, 11', 21 and 31, the material is not especially limited if the material has flexibility appropriate for the roller imprint, and has optical transparency to transmit light to harden the molding resin layer in the roller imprint processing, such as ultraviolet rays, and a transparent flexible material, such as transparent resin film, optical resin film, and sheet glass, can be used. The plan view shapes of the substrates 12, 22 and 32 are not especially limited, and may be any appropriate shape, such as a rectangle and a long body. In the present invention, optical transparency means that light transmittance in the 200 nm to 400 nm wavelength range is 50% or more, preferably 70% or more. Light transmittance can be measured using a V-650 spectrophotometer manufactured by JASCO Corporation.

Figure 10:
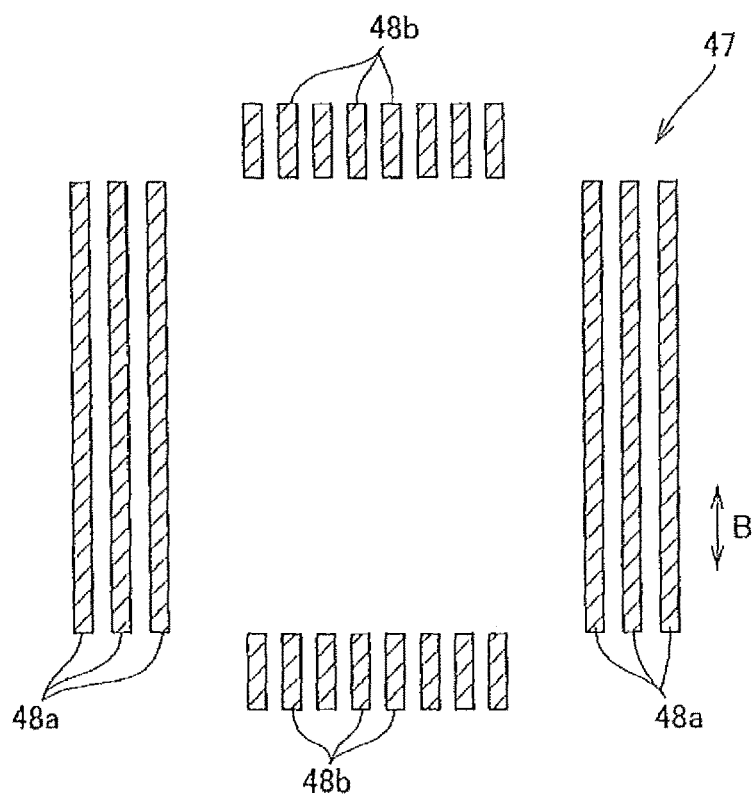
FIG. 10 is a plan view depicting another example of a measurement pattern of the imprint mold of the present invention.
Figure 11:
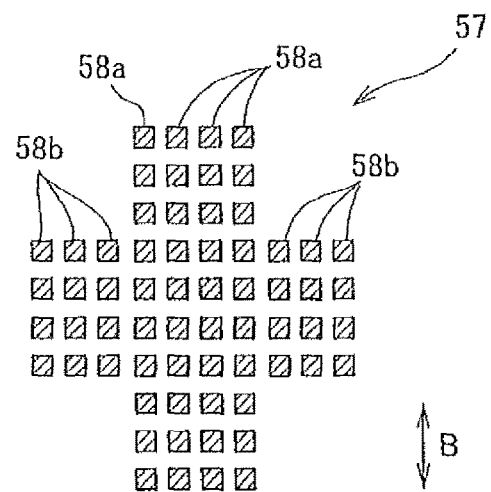
FIG. 11 is a plan view depicting another example of a measurement pattern of the imprint mold of the present invention.

The above-mentioned imprint molds are examples, and the present invention is not limited to these embodiments. In the above embodiments, the contour shape of the measurement pattern, in which a plurality of line-shaped unit convex patterns are arrayed with desired intervals, is cross-shaped, but the contour shape of the measurement pattern is not limited to cross-shaped. For example, as illustrated in FIG. 10, a plurality of line-shaped unit convex patterns 48a are arrayed with desired intervals in the direction indicated by the arrow mark B, and a plurality of line-shaped unit convex patterns 48b are arrayed with desired intervals also in the direction indicated by the arrow mark B, so that the contour shape of the measurement pattern 47 becomes mouth-shaped, constituted by these two types of unit convex patterns. Further, as illustrated in FIG. 11, a plurality of line-shaped unit convex patterns 58a, on which many notches are formed, are arrayed with desired intervals in a direction indicated by the arrow mark B, and a plurality of line-shaped unit convex patterns 58b, on which many notches are formed, are arrayed with desired intervals also in the direction indicated by the arrow mark B, so that the contour shape of the measurement pattern 57 becomes cross-shaped, constituted by these two types of unit convex patterns. In FIG. 10 and FIG. 11, the unit convex patterns 48a and 48b and the unit convex patterns 58a and 58b are indicated by the hatched lines.

[Imprint Method]

An imprint method of the present invention is a roller imprint method, where the above-mentioned imprint mold of the present invention is used, and the mold is contacted with the molding resin layer by pressing the mold from the rear surface (surface on which the relief structure is not formed), the contacted molding resin layer is hardened, then the hardened resin layer is separated from the mold. This imprint method will be described using an example of a case when the above-mentioned imprint mold 11 of the present invention is used.

FIG. 12A to FIG. 12C and FIG. 13A and FIG. 13B are processing drawings depicting an embodiment of the imprint method of the present invention. FIG. 14 is a partial longitudinal sectional view at the III-III line in a transfer substrate in FIG. 13B.

Figure 12A:
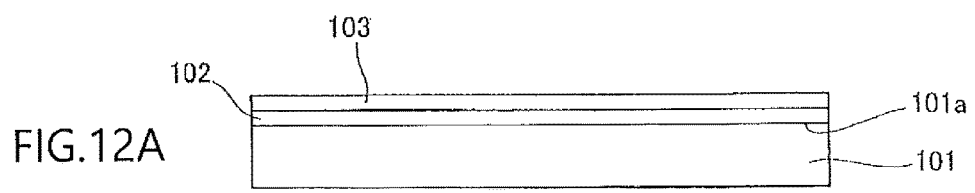
FIG. 12A to FIG. 12C are process drawings depicting an embodiment of the imprint method of the present invention.

In this embodiment, a molding resin layer 103 is formed on an etching layer 102 of a transfer substrate 101, which includes the etching layer 102 on one surface 101a (FIG. 12A).

The transfer substrate 101 used for the imprint method of the present invention can be appropriately selected, such as glass (e.g. quartz, soda line glass, borosilicate glass), semiconductor (e.g. silicon, gallium arsenide, gallium nitride), resin substrate (e.g. polycarbonate, polypropylene, polyethylene), metal substrate or a composite material substrate constituted by an arbitrary combination of the above materials. On the transfer substrate 101, for instance, a desired pattern structure, such as micro wires used for semiconductors and displays, and an optical structure (e.g. a photonic crystal structure, optical wave guide, holography) may be formed. The etching layer 102 may be a thin film constituted by a material required for a pattern which is formed on the transfer substrate 101, and can be appropriately selected from inorganic thin film, organic thin film, organic-inorganic composite thin film and the like.

The shape of the transfer substrate 101 in this example is flat plate-shaped, but, for instance, the substrate 101 may have a mesa structure having convex plane part protruding from the periphery on one surface 101a.

The molding resin layer 103 may be formed using a desired resin composition, such as a photosetting resin composition and a thermosetting resin composition, by a known coating method, such as a spin coating method, a dispense coating method, a dip coating method, a spray coating method and an inkjet method. The thickness of the molding resin layer 103 can be set considering, for example, the height of the convex portions or the depth of the concave portions of the relief structure of the mold to be used, and the permissible range of the thickness of the residual film (portions between convex portions) generated in the pattern structure to be formed.

<Pressure Bonding Step>

Figure 12B:
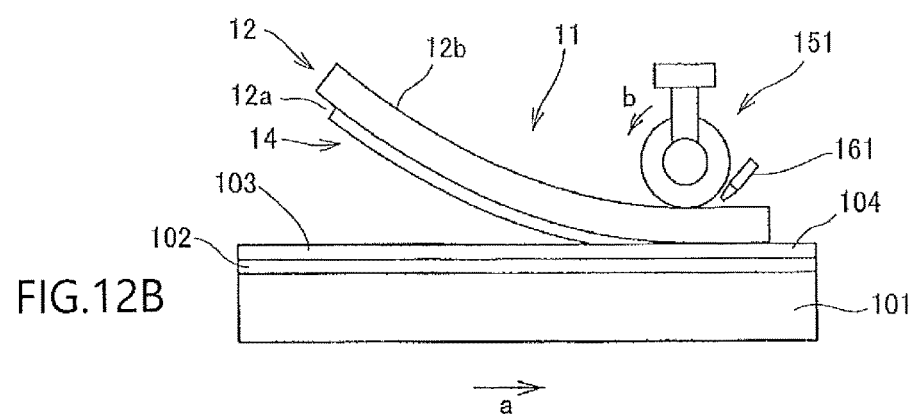
Figure 13A:
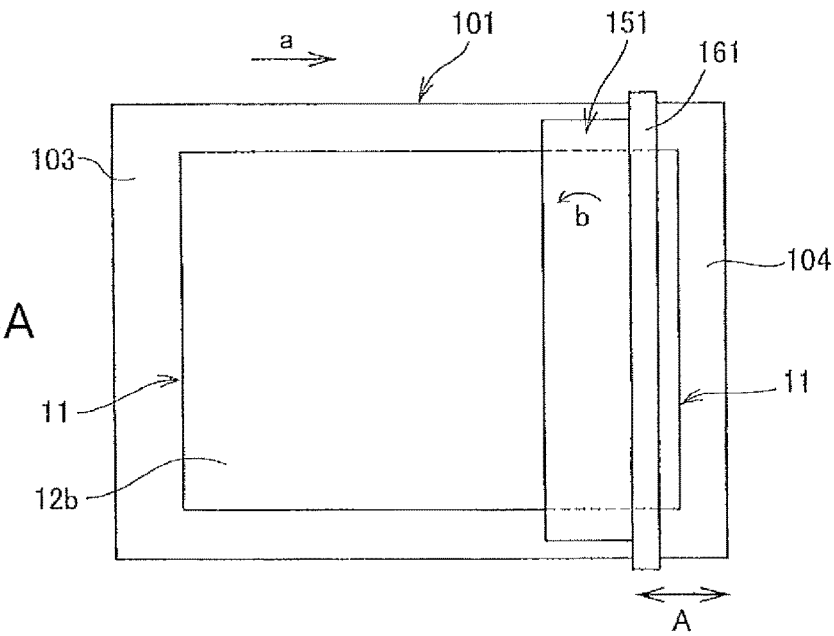
FIG. 13A and FIG. 13B are process drawings depicting an embodiment of the imprint method of the present invention.
Figure 14:
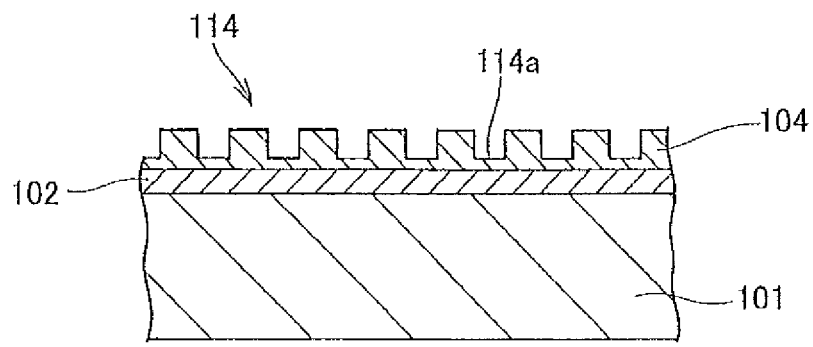
FIG. 14 is a partial longitudinal sectional view at the III-III line in the transfer substrate in FIG. 13B.

Next in the pressure bonding step, an imprint mold 11, which is flexible and has a relief structure on one surface 12a, is pressed using a roller 151 from the surface 12b on which the relief structure is not formed, so that the surface 12a, on which the relief structure is formed, of the imprint mold 11 is pressure-bonded to the molding resin layer 103 (FIG. 12B, FIG. 13A).

The imprint mold to be used is the above mentioned imprint mold 11 of the present invention, where the main pattern 14 constituted by a plurality of line-shaped main convex patterns 15, which are arrayed with predetermined intervals, is disposed in the main pattern region 13 which is set on one surface 12a of the substrate 12 having flexibility, and a measurement pattern 17, constituted by a plurality of line-shaped unit convex patterns 18a and 18b which are arrayed with predetermined intervals, is disposed in the measurement pattern region 16, which is set on the surface 12a. This means that the imprint mold 11 has a relief structure constituted by the main pattern 14 and the measurement pattern 17. In FIG. 12B, the main pattern 14 of the imprint mold 11 is illustrated, and the measurement pattern 17 is omitted for convenience. In FIG. 13A, the direction of the main convex patterns 15, constituting the main pattern 14 of the imprint mold 11, is indicated by the arrow mark A.

As illustrated in FIG. 12B and FIG. 13A, when the surface 12a having the relief structure of the imprint mold 11 is pressure-bonded to the molding resin layer 103 by pressure of the roller 151, the transfer substrate 101 is transported in the arrow mark a direction, and the roller 151 is rotated in the arrow mark b direction, so that the imprint mold 11 and the molding resin layer 103 move at the same speed, and no shift is generated there between. In this pressure-bonding step, the imprint mold 11 is pressure-bonded to the molding resin layer 103 in the line direction of the main pattern 14 of the imprint mold 11 (the direction indicated by the arrow mark A in FIG. 13A, and also the line direction of the measurement pattern 17 of the imprint mold 11). Thereby deformation of the main pattern 14 and the measurement pattern 17 of the imprint mold 11 can be suppressed.

The pressure by the roller 151 can be appropriately set within a range where the relief structure, constituted by the main pattern 14 and the measurement pattern 17 of the imprint mold 11, can be completely buried in the molding resin layer 103. Therefore, for instance, if the distance from a stage (not illustrated) that transports the transfer substrate 101 to the roller 151 is fixed to a desired value, and the relief structure of the imprint mold 11 is completely buried in the molding resin layer 103 when the transfer substrate 101 and the imprint mold 11 pass between the stage and the roller 151, then there is no need to press the imprint mold by applying force to the roller 151 in the direction toward the transfer substrate 101 direction.

<Hardening Step>

Then the molding resin layer 103 pressure-bonded with the imprint mold 11 is hardened, whereby a transferred resin layer 104, in which the relief structure constituted by the main pattern 14 and the measurement pattern 17 of the imprint mold 11 is transferred, is formed.

In the example illustrated in FIG. 12B and FIG. 13A, light is irradiated from a light irradiation apparatus 161 via the imprint mold 11 immediately after the molding resin layer 103 is pressure-bonded with the imprint mold 11, whereby the molding resin layer 103 is hardened to be the transferred resin layer 104, but the transferred resin layer 104 may be formed by hardening the molding resin layer 103 after the pressure-bonding of the imprint mold 11 and the molding resin layer 103 is completed. If the transfer substrate 101 has optical transparency, the light irradiation apparatus 161 may be set on the rear surface side of the transfer substrate 101, so that the light is irradiated from the light irradiation apparatus 161, via the transfer substrate 101, to the molding resin layer 103 of which pressure-bonding with the imprint mold 11 is completed, thereby the molding resin layer 103 is hardened. Further, the molding resin layer 103, of which pressure-bonding with the imprint mold 11 is completed, may be hardened using both the light irradiation from the light irradiation apparatus 161 via the imprint mold 11, and the light irradiation from the light irradiation apparatus 161 via the transfer substrate 101.

<Separating Step>

Figure 12C:
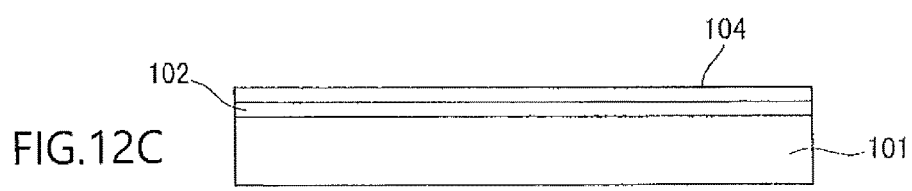
Figure 13B:
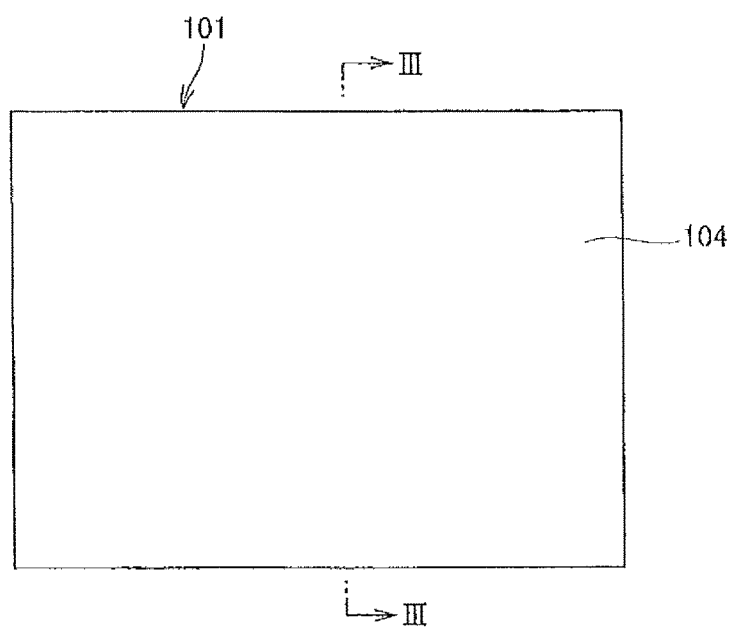

Then the transferred resin layer 104 and the imprint mold 11 are separated, whereby the pattern structure, which is the transferred resin layer 104, is disposed on the transfer substrate 101 (FIG. 12C, FIG. 13B). The transferred resin layer 104, which was formed like this, has a main pattern 114 of which the concave/convex portions of the main pattern 14 of the imprint mold 11 are inverted, as illustrated in FIG. 14, and the measurement mark (not illustrated), of which the concave/convex portions of the measurement pattern 17 are inverted. In FIG. 13B, the relief structure (main pattern and measurement mark) included in the formed transferred resin layer 104 is omitted.

It is preferable that the transferred resin layer 104 and the imprint mold 11 are separated in the line direction of the main pattern 14 of the imprint mold 11 (that is, the line direction of the measurement pattern 17 of the imprint mold 11), just like the above-mentioned pressure-bonding step. Then the generation of pattern defects in the transferred resin layer 104, due to the deformation or damage of the main pattern 114 and the measurement mark (not illustrated), can be suppressed.

The transferred resin layer 104 and the imprint mold 11 can be separated after the pressure-bonding of the imprint mold 11 to the molding resin layer 103 and the formation of the transferred resin layer 104 by hardening the molding resin layer 103 are completed. Further, before the pressure-bonding of the imprint mold 11 to the molding resin layer 103 completes, the imprint mold 11 may be appropriately separated from the transferred resin layer 104, formed by hardening of the molding resin layer 103 to which the imprint mold 11 has already been pressure-bonded. Furthermore, after the transferred resin layer 104 and the imprint mold 11 are separated, additional exposure may be performed to completely harden the transferred resin layer 104.

A residual film 114a (see FIG. 14) is removed from the main pattern 114 and the measurement mark (not illustrated) of the pattern structure, which is the transferred resin layer 104 formed as described above, then the etching layer 102 is etched using the pattern structure as a mask, whereby a desired pattern can be formed on the transfer substrate 101. Further, by etching the transfer substrate 101 using the pattern formed like this as a mask, the relief structure can be formed on the transfer substrate 101.

The imprint method of the present invention is a roller imprint using the imprint mold of the present invention, which can suppress deformation of the pattern when the imprint mold and the molding resin layer are pressure-bonded, whereby a roller imprint with less generation of defects can be implemented. As a result, error measurement, positional alignment and the like, of the main pattern generated by the roller imprint, can be performed as high precision using the measurement pattern. Further, the direction of separating the transferred resin layer and the imprint mold in the roller imprint is the same as the line direction of the main pattern of the imprint mold, hence deformation of the pattern to be formed is further suppressed, and the pattern can be formed at high precision.

The above-mentioned embodiment of the imprint method is an example, and the present invention is not limited to this method. For example, the transfer substrate 101 may not include the etching layer 102, and the molding resin layer 103 may be directly disposed on the transfer substrate 101.

[Wire Grid Polarizer]

Figure 15:
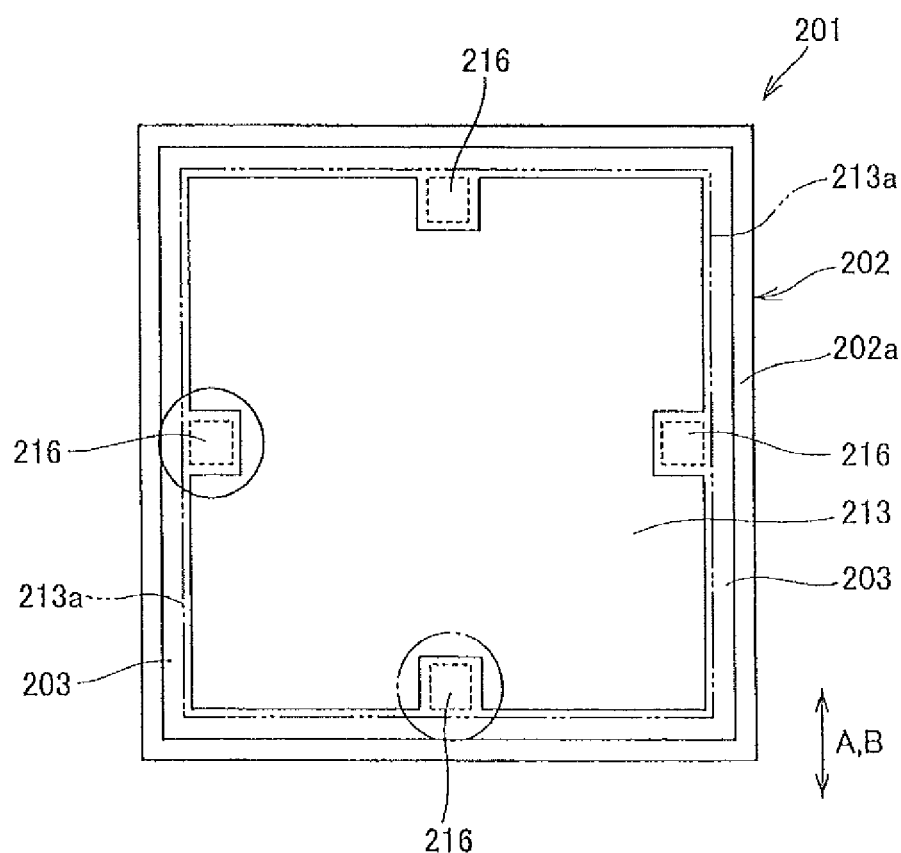
FIG. 15 is a plan view depicting an embodiment of a wire grid polarizer of the present invention.
Figure 16:
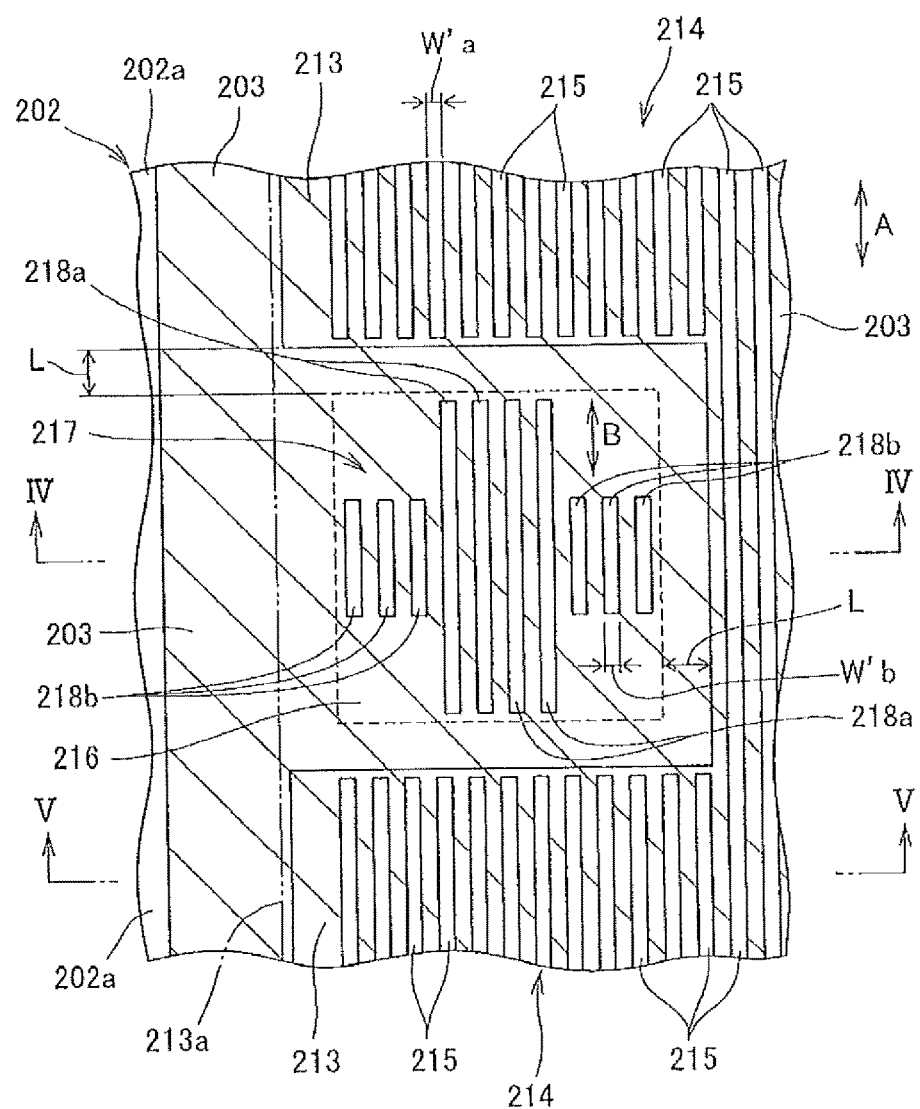
FIG. 16 is an enlarged plan view of a part enclosed by a solid line circle in the wire grid polarizer in FIG. 15.
Figure 17:
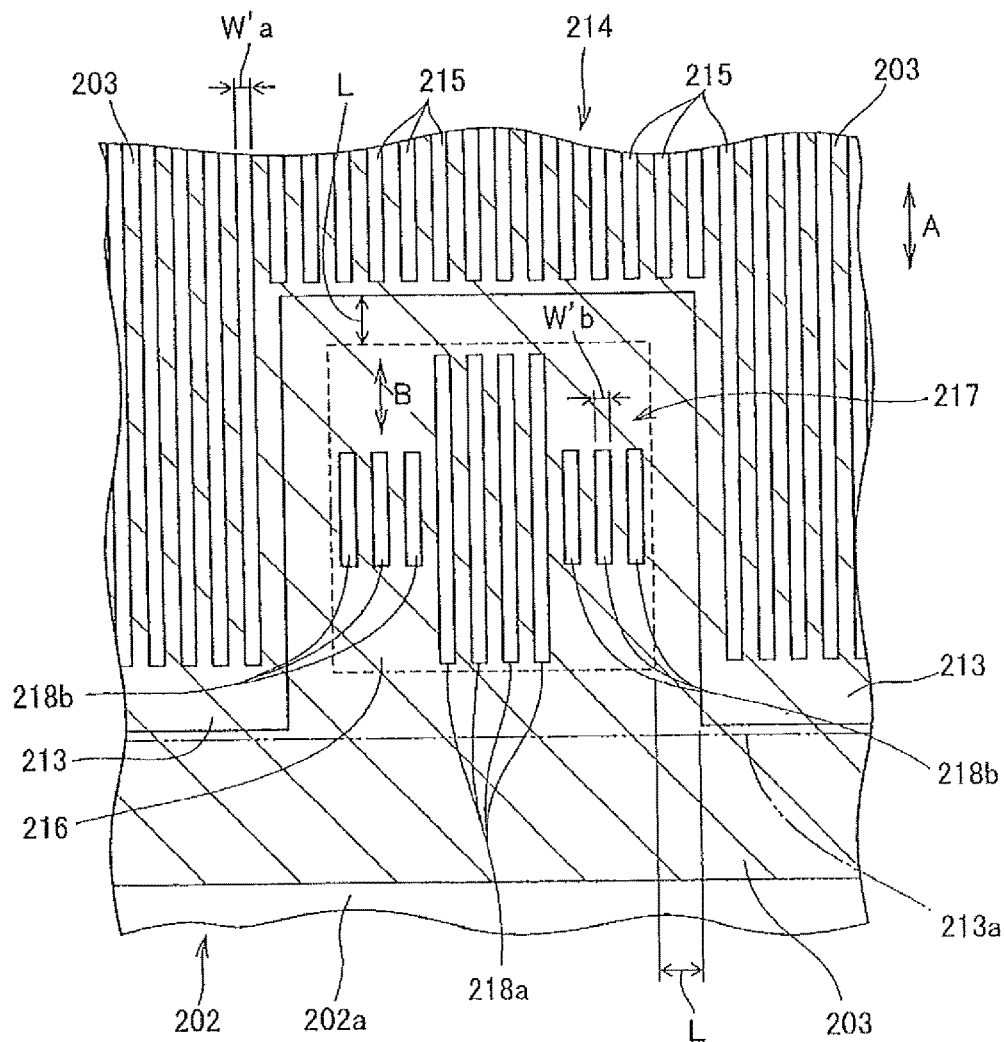
FIG. 17 is an enlarged plan view of a part enclosed by a dashed line circle in the wire grid polarizer in FIG. 15.
Figure 18:
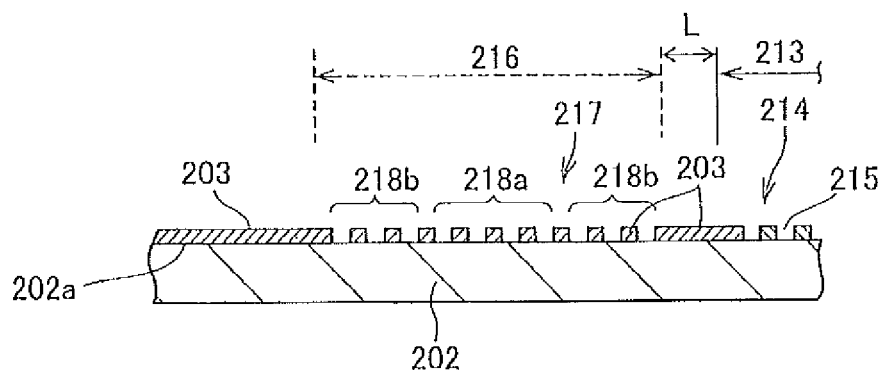
FIG. 18 is a longitudinal sectional view at the IV-IV line in the wire grid polarizer in FIG. 16.
Figure 19:
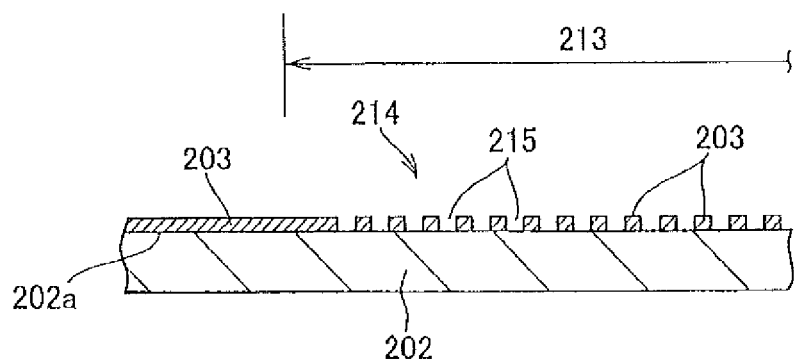
FIG. 19 is a longitudinal sectional view at the V-V line in the wire grid polarizer in FIG. 16.

FIG. 15 is a plan view depicting an embodiment of a wire grid polarizer of the present invention, FIG. 16 is an enlarged plan view of a part enclosed by the solid line circle in the wire grid polarizer in FIG. 15, and FIG. 17 is an enlarged plan view of a part enclosed by the dashed line circle in the wire grid polarizer in FIG. 15. FIG. 18 is a longitudinal sectional view at the IV-IV line in the wire grid polarizer in FIG. 16, and FIG. 19 is a longitudinal sectional view at the V-V line in the wire grid polarizer in FIG. 16.

In FIG. 15 to FIG. 19, the wire grid polarizer 201 has a transparent substrate 202, a wire grid material layer 203 disposed on one surface 202a of the transparent substrate 202, and a wire grid region 213 and a measurement pattern region 216 which are set on the wire grid material layer 203. In FIG. 16 and FIG. 17, the wire grid material layer 203 is indicated by hatched lines.

In the illustrated example, the wire grid region 213 is enclosed by the solid line, and the measurement pattern region 216 is enclosed by the dashed line. As illustrated in FIG. 15, the wire grid region 213 has a rectangular contour, and a concave region is disposed in each side of the rectangle. The measurement pattern region 216 is disposed in each of the above-mentioned concave regions of the wire grid region 213.

In the wire grid polarizer 201 of the present invention, it is preferable that the measurement pattern region 216 includes at least a region disposed inside the contour line 213a of the wire grid region 213. In the illustrated example, the entire measurement pattern region 216 is disposed inside the contour line 213a of the wire grid region 213. In the illustrated example, the contour line 213a of the wire grid region 213 is indicated by the two-dot chain line.

Figure 21:
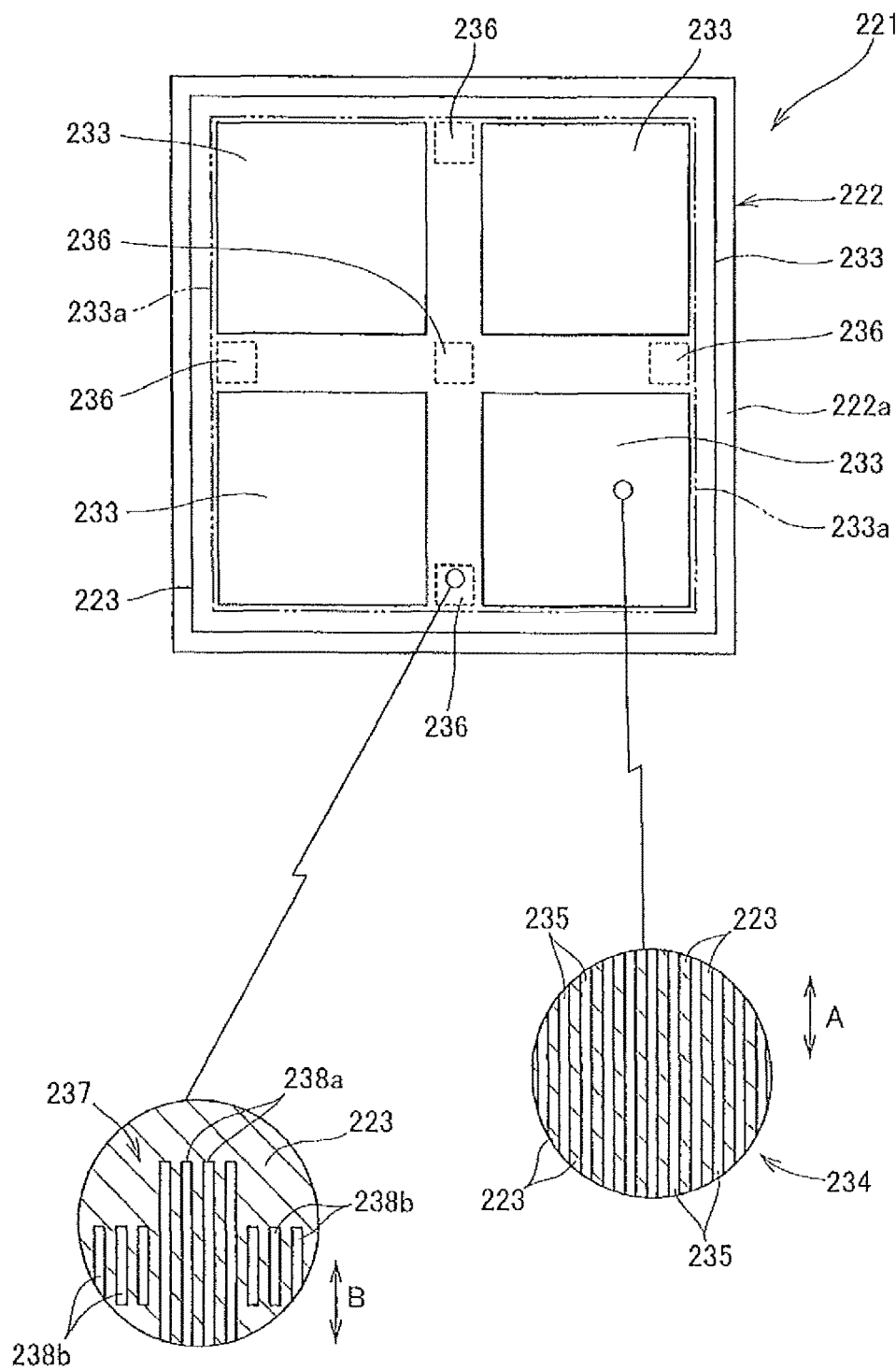
FIG. 21 is a plan view depicting another embodiment of the wire grid polarizer of the present invention.

Here the contour line of the wire grid region is a line enclosing the outside of the wire grid region, and if the concave regions for setting the measurement pattern regions 216 exist in the wire grid region 213 as illustrated, the line enclosing the outside of the main pattern region, so as to include these concave regions, is the contour line. If a plurality of wire grid regions are set close to one another, as illustrated in FIG. 21, which is described later, the line enclosing the outside of the plurality of wire grid regions, so as to include the wire grid regions, is the contour line. In the illustrated example, the contour line 213a is indicated slightly distant from the wire grid region 213, so that the periphery of the wire grid region 213 and the contour line 213a can be easily distinguished. This is the same for the other embodiments described herein below.

In the wire grid region 213 which is set in the wire grid material layer 203, a wire grid 214, constituted by a plurality of line-shaped main openings 215 which are arrayed with desired intervals (wire grid material layer), is disposed. In the illustrated example, the line-shaped main openings 215 disposed in the direction indicated by the arrow mark A are formed in the entire wire grid region 213. The line width W'a of each line-shaped main opening 215 (see FIG. 16 and FIG. 17) can be appropriately set within a 400 nm range or less, depending on the intended use of the wire grid polarizer, and the width of the interval between the main openings 215 (wire grid material layer) can also be appropriately set within a 400 nm range or less, depending on the intended use of the wire grid polarizer. In FIG. 15, the main openings 215 and the later mentioned unit openings 218a and 218b are omitted.

In the measurement pattern region 216, which is set on the wire grid material layer 203, a measurement pattern 217, constituted by a plurality of line-shaped unit openings 218a and 218b, which are arrayed with desired intervals (wire grid material layer), is disposed. In the illustrated example, the line-shaped unit openings 218a are arranged with desired intervals in the direction indicated by the arrow mark B, the line-shaped unit openings 218b are also arrayed with desired intervals in the direction indicated by the arrow mark B, and the measurement pattern 217, constituted by these two types of unit openings has a cross-shaped contour.

In the present invention, the line direction of the main openings 215 constituting the wire grid 214 (direction indicated by the arrow mark A), and the line direction of the unit openings 218a and 218b constituting the measurement pattern 217 (direction indicated by the arrow mark B), are the same. Further, the line width W'b of each line-shaped unit opening 218a or 28b constituting the measurement pattern 217 (see FIG. 16 and FIG. 17) is the same as the line width W'a of each line-shaped main opening 215. If this wire grid polarizer 201 of the present invention is used, linearly polarized light is acquired even in a part where the measurement pattern exists, the difference between the extinction ratio in the wire grid region 213 and the extinction ratio in the measurement pattern region 216 is suppressed, and the problem of photo-alignment processing can be prevented. Further, in the case when the measurement pattern region 216 has at least a region disposed inside the contour line 213a of the wire grid region 213, the measurement pattern and the wire grid are disposed close to each other, therefore the position, direction and the like of the wire grid can be accurately measured by measuring the measurement pattern, and an effective polarization region of the wire grid polarizer can be set wider. As a result, the plurality of wire grid polarizers can be aligned at high precision using the measurement pattern, and good photo-alignment processing can be performed with suppressing the shift of the polarizing axes. It is preferable that the width of the interval (wire grid material layer) between the unit openings 218a or 218b and the width of the interval (wire grid material layer) between main openings 215 are also the same.

Here "the line direction of the main openings 215 constituting the wire grid 214 and the line direction of the unit openings 218a and 218b constituting the measurement pattern 217 are the same" means that the difference of these line directions is 5° or less, and this is the same for the description of the other embodiments herein below. "The line width W'a of the main opening 215 and the line width W'b of each unit opening 218a and 218b are the same" means that the difference of these line widths is 5 nm or less, and this is the same for the description of the other embodiments herein below.

In the present invention, it is preferable that the center line of each unit opening 218a and 218b (line in the direction indicated by the arrow mark B in FIG. 16 and FIG. 17) matches with the center line of the main opening 215 disposed on the extension of the above center line (line in the direction indicated by the arrow mark A in FIG. 16 and FIG. 17), and the positional shift of these center lines in the case of not matching is preferably less than half of the line width W'b of each unit opening 218a and 218b. Then the linearly polarized light is acquired, even in a part of the wire grid polarizer 201 where the measurement pattern exists, and the shift of the polarizing axes between this linearly polarized light and the linearly polarized light in the wire grid region 213 is prevented, as mentioned above.

As described above, the measurement pattern 217, constituted by the line-shaped unit openings 218a and 218b, includes a part which can be observed by an observation unit. For example, in the case when the observation unit is an optical microscope, a part or all of the measurement pattern 217 constituted by a plurality of unit openings 218a or a plurality of unit openings 218b, can be observed by the optical microscope, even if an individual unit opening 218a or unit opening 218b cannot be observed by the optical microscope. Examples of the observation unit, other than the optical microscope, are a fluorescent microscope, a laser microscope, a Raman microscope or the like.

In the wire grid polarizer 201 of the present invention, the distance L between the wire grid region 213 and the measurement pattern region 216 (see FIG. 16 to FIG. 18) can be 100 μm or less, preferably 30 μm or less. If the distance L between the wire grid region 213 and the measurement pattern region 216 exceeds 100 μm, the surface area of the wire grid region 213 decreases, which is not desirable.

Figure 20:
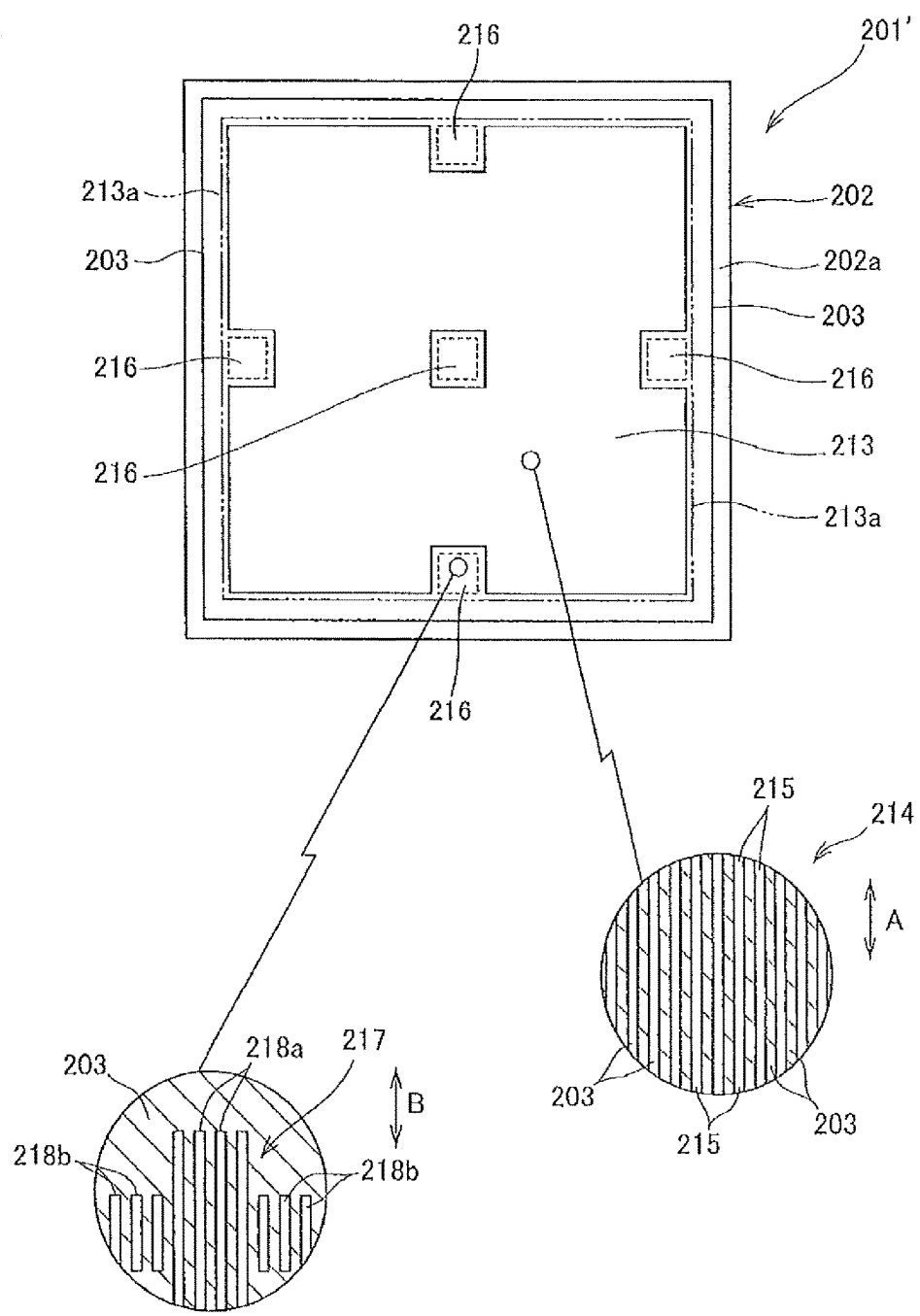
FIG. 20 is a plan view depicting another embodiment of the wire grid polarizer of the present invention.

In the above-mentioned wire grid polarizer 201, the measurement pattern region 216 is disposed in a concave region, which is disposed in each side of the wire grid region 213 having a rectangular contour, but the wire grid polarizer 201', in which the measurement pattern region 216 also disposed in the center part of the wire grid region 213, may be used, as illustrated in FIG. 20. The positions and number of measurement pattern regions 216 disposed in a region inside the wire grid region 213 are not limited to those illustrated in FIG. 20.

In FIG. 20, the main openings 215 and the unit openings 218a and 218b are omitted, and a part of the wire grid region 213 and a part of the measurement pattern region 216 are separately illustrated as enlarged plan views, in which the wire grid material layer 203 is indicated by the hatched lines.

In the wire grid polarizer of the present invention, a plurality of wire grid regions may be set close to one another. FIG. 21 is a plan view depicting an example of such a wire grid polarizer. In FIG. 21, the wire grid polarizer 221 has a transparent substrate 222, a wire grid material layer 223 disposed on one surface 222a of the transparent substrate 222, and four wire grid regions 233 and measurement pattern regions 236 which are set on the wire grid material layer 223. In the illustrated example, the wire grid region 233 is enclosed by the solid line, and the measurement pattern region 236 is enclosed by the dashed line. As illustrated in FIG. 21, in the case when four wire grid regions are set close to one another, a contour line 233a (indicated by the two-dot chain line) is the line enclosing the outside of the wire grid region, so as to include these wire grid regions 233. In this wire grid polarizer 221, the measurement pattern regions 236 are disposed inside the contour line 233a, which is drawn to include the four wire grid regions 233.

In each wire grid region 233 which is set on the wire grid material layer 223, a wire grid 234, constituted by a plurality of line-shaped main openings 235 which are arrayed with desired intervals (wire grid material layer), is disposed. In the illustrated example, the line-shaped main openings 235, disposed in the direction indicated by the arrow mark A, are formed in the four wire grid regions 233 respectively. In each of the five measurement pattern regions 236, a measurement pattern 237, in which a plurality of line-shaped unit openings 238a and 238b are arrayed with desired intervals, is disposed. In the illustrated example, the measurement pattern 237 is constituted by two types of unit openings: line-shaped unit openings 238a disposed in a direction indicated by the arrow mark B; and line-shaped unit openings 238b also disposed in a direction indicated by the arrow mark B, whereby the contour of the measurement pattern 237 becomes cross-shaped. In FIG. 21, the main openings 235 and the unit openings 238a and 238b are omitted, and a part of the wire grid region 233 and a part of the measurement pattern region 236 are separately illustrated as enlarged plan views, in which the wire grid material layer 223 is indicated by the hatched lines.

In this wire grid polarizer 221 as well, the line direction of the main openings 235 disposed in the wire grid region 233 (direction indicated by the arrow mark A) and the line direction of the unit openings 238a and 238b disposed in the measurement pattern region 236 (direction indicated by the arrow mark B) are the same. The line width of each line-shaped main opening 235 and the line width of each line-shaped unit openings 238a and 238b are also the same. Further, the distance between the wire grid region 233 and the measurement pattern region 236 can be 100 μm or less, preferably 30 μm or less.

Figure 22:
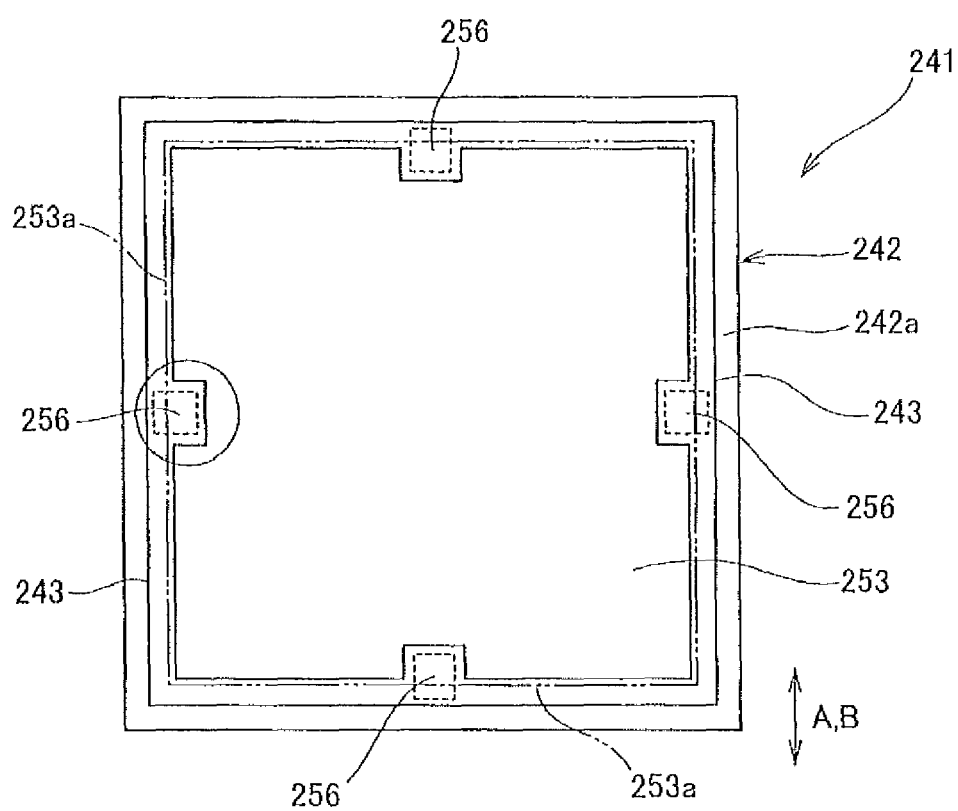
FIG. 22 is a plan view depicting another embodiment of the wire grid polarizer of the present invention.
Figure 23:
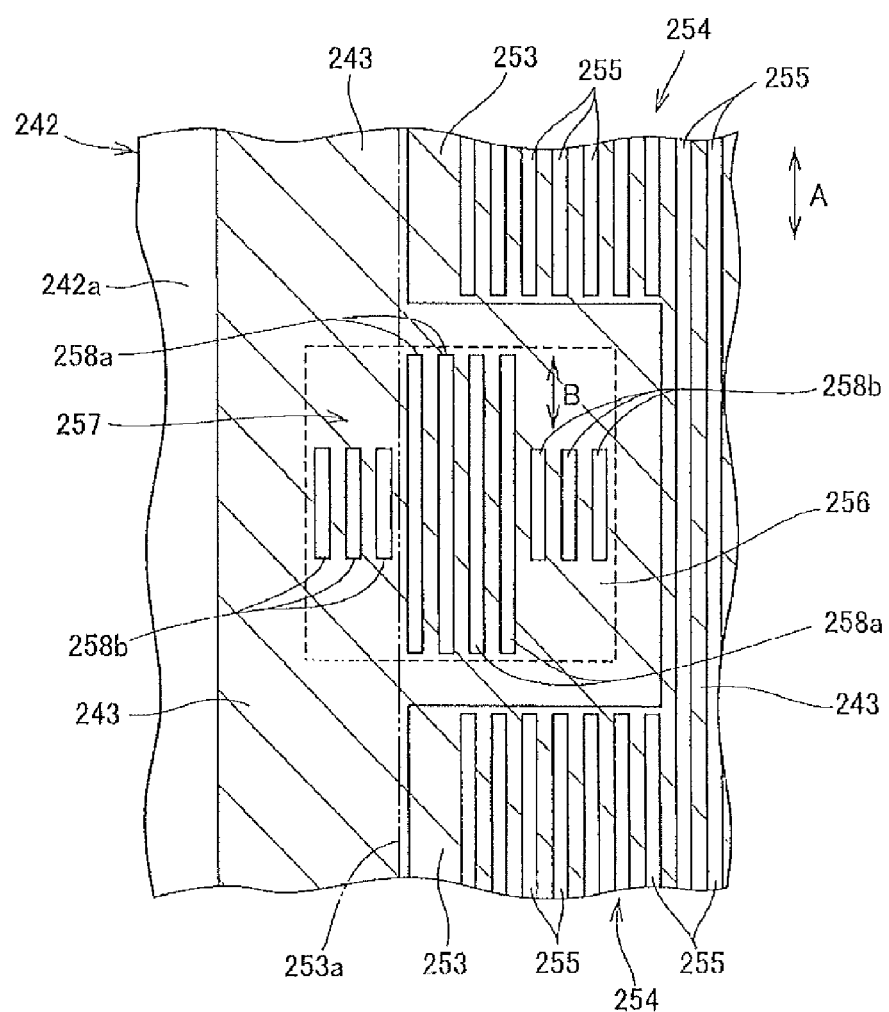
FIG. 23 is an enlarged plan view of a part enclosed by a solid line circle in the wire grid polarizer in FIG. 22.

FIG. 22 is a plan view depicting another embodiment of the wire grid polarizer of the present invention, and FIG. 23 is an enlarged plan view of the part enclosed by the solid line circle in the wire grid polarizer in FIG. 22. In FIG. 22 and FIG. 23, the wire grid polarizer 241 has a transparent substrate 242, a wire grid material layer 243 which is disposed on one surface 242a of the transparent substrate 242, and a wire grid region 253 and a measurement pattern region 256 which are set on the wire grid material layer 243. In the illustrated example, the wire grid region 253 is enclosed by the solid line, and the measurement pattern region 256 is enclosed by the dashed line. As illustrated in FIG. 22, the wire grid region 253 has a rectangular contour, and a concave region is disposed in each side of the rectangle. The measurement pattern region 256 is disposed in each concave region, and a part of the measurement pattern region 256 is in the wire grid region 253. Therefore, the other region of the measurement pattern region 256 is disposed outside the contour line 253a (indicated by the two-dot chain line) of the wire grid region 253, which is different from the wire grid polarizer 201.

In the wire grid region 253 which is set on the wire grid material layer 243, a wire grid 254, constituted by a plurality of line-shaped main openings 255, which are arrayed with predetermined intervals (wire grid material layer), is disposed. In the illustrated example, the line-shaped main openings 255 are formed in the entire wire grid region 253 in the direction indicated by the arrow mark A. Further, in each of the four measurement pattern regions 256, a measurement pattern 257, constituted by a plurality of line-shaped unit openings 258a and 258b, which are arrayed with desired intervals, is disposed. In the illustrated example, the measurement pattern 257 is constituted by two types of unit openings: line-shaped unit openings 258a disposed in a direction indicated by the arrow mark B; and line-shaped unit openings 258b also disposed in the direction indicated by the arrow mark B, whereby the contour of the measurement pattern 257 becomes cross-shaped. In FIG. 22, the main openings 255 and the unit openings 258a and 258b are omitted.

In this wire grid polarizer 241 as well, the line direction of the main openings 255 disposed in the wire grid region 253 (direction indicated by the arrow mark A) and the line direction of the unit openings 258a and 258b disposed in the measurement pattern region 256 (direction indicated by the arrow mark B) are the same. The line width of each line-shaped main opening 255 and the line width of each line-shaped unit opening 258a or 258b are also the same. Further, the distance between the wire grid region 253 and the measurement pattern region 256 can be 100 μm or less, preferably 30 μm or less.

For the transparent substrates 202, 222 and 242 that constitute the wire grid polarizers 201, 201', 221 and 241, a rigid material (e.g. quartz glass, synthetic silica, magnesium fluoride) or a transparent flexible material (e.g. transparent resin film, optical resin plate) can be used.

In the present invention, "transparent" means that light transmittance in a 200 nm to 800 nm wavelength range is 50% or more, preferably 70% or more. Light transmittance can be measured using a V-650 spectrophotometer manufactured by JASCO Corporation.

For the material of the wire grid material layers 203, 223 and 243 constituting the wire grid polarizers 201, 201', 221 and 241, such conductive material as metal and a metal compound, and dielectric material can be used (e.g. aluminum, gold, silver, copper, platinum, molybdenum silicide, titanium oxide), and one of these materials may be used alone or in some combination with another material. The thickness of this wire grid material layer can be appropriately set in a 10 nm to 500 nm range.

The above-mentioned embodiments of the wire grid polarizer are examples, and the present invention is not limited to these embodiments.

In the above embodiments, the contour shape of the measurement pattern, in which a plurality of line-shaped unit openings are arrayed with desired intervals (wire grid material layer), is cross-shaped, but the contour shape of the measurement pattern is not limited to cross-shaped. For example, a plurality of line-shaped unit openings having different lengths are arrayed in a same direction, so that the contour shape of the measurement pattern becomes mouth-shaped (see FIG. 10). Further, a plurality of line-shaped unit openings having different lengths, on which many notches are formed, may be arrayed with desired intervals in a same direction, so that the contour shape of the measurement pattern becomes cross-shaped (see FIG. 11).

[Method for Manufacturing Wire Grid Polarizer]

A method for manufacturing the wire grid polarizer of the present invention uses the above-mentioned imprint mold of the present invention, where a resist pattern layer is formed on a wire grid material layer disposed on a transparent substrate by the above-mentioned imprint method of the present invention, and the wire grid material layer is etched using this resist pattern layer as a mask, whereby the openings are formed.

This method for manufacturing the wire grid polarizer will be described using an example of a case of manufacturing the wire grid polarizer 201 using the above-mentioned imprint mold 11 of the present invention.

FIG. 24A to FIG. 24D are processing drawings depicting an embodiment of the method for manufacturing the wire grid polarizer of the present invention.

Figure 24A:
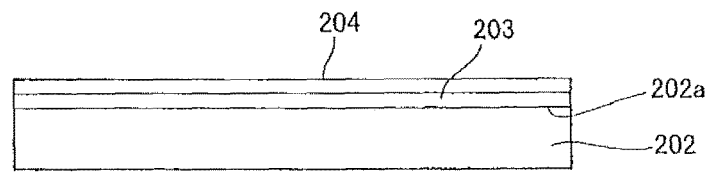
FIG. 24A to FIG. 24D are processing drawings depicting an embodiment of a method for manufacturing the wire grid polarizer of the present invention.

In this embodiment, the wire grid material layer 203 is formed on one surface 202a of the transparent substrate 202, and the etching resist layer 204 is formed on the wire grid material layer 203 (FIG. 24A).

For the transparent substrate 202, the transparent substrate described in the wire grid polarizer of the present invention can be used. The wire grid material layer 203 can be constituted by the material described in the wire grid polarizer of the present invention, and can be formed to a desired thickness using a vacuum film deposition method or the like.

The etching resist layer 204 is for implementing etching resistance when the wire grid material layer 203 is etched, and any appropriate material can be selected from conventional etching resist materials in accordance with the material of the wire grid material layer 203 and the like. A thin metal film may be formed on the wire grid material layer 203, so that a hard mask is formed by etching this thin metal film via the etching resist layer 204, and the wire grid material layer 203 is etched via this hard mask. The etching resist layer 204 may be formed using a known coating method, such as a spin coating method, a dispense coating method, a dip coating method, a spray coating method and an inkjet method. The thickness of the etching resist layer 204 can be set considering, for example, the height of the main convex patterns 15 and unit convex patterns 18a and 18b of the imprint mold 11 to be used, and the permissible range of the thickness of the residual film (portions between convex patterns) generated in the resist pattern to be formed.

<Pressure Bonding Step>

Figure 24B:
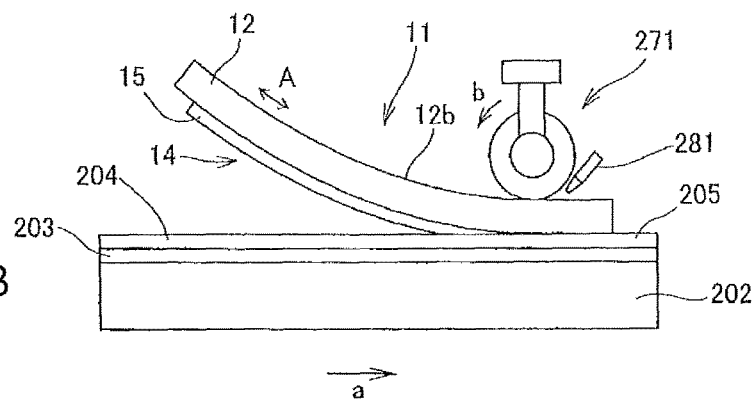

Next in the pressure-bonding step, the imprint mold 11, which is flexible and has a relief structure on one surface 12a, is pressed from the surface 12b on which the relay structure is not formed, so that the surface 12a, on which the relief structure is formed using the roller 271, of the imprint mold 11 is pressure-bonded to the etching resist layer 204 (FIG. 24B).

The imprint mold to be used is the above mentioned imprint mold 11 of the present invention, where the main pattern 14 constituted by a plurality of line-shaped main convex patterns 15, which are arrayed with predetermined intervals, is disposed in the main pattern region 13 which is set on one surface 12a of the substrate 12 having flexibility, and a measurement pattern 17, constituted by a plurality of line-shaped unit convex patterns 18a and 18b which are arrayed with predetermined intervals, is disposed in the measurement pattern region 16, which is set on the surface 12a. This means that the imprint mold 11 has a relief structure constituted by the main pattern 14 and the measurement pattern 17. In the imprint mold 11, the line direction of the main pattern 14 and the line direction of the measurement pattern 17 are the same, and the line width of each line-shaped main convex pattern 15 constituting the main pattern 14 and each line-shaped unit convex pattern 18a or 18b constituting the measurement pattern 17 are the same. In FIG. 24B, only the main pattern 14 is illustrated, and the measurement pattern 17 is omitted.

When the surface 12a having the relief structure of the imprint mold 11 is pressure-bonded to the etching resist layer 204 by pressure of the roller 271, the transparent substrate 202 is transported in the arrow mark a direction, and the roller 271 is rotated in the arrow mark b direction, so that the imprint mold 11 and the etching resist layer 204 move at the same speed, and no shift is generated there between. In this pressure-bonding step, the imprint mold 11 is pressure-bonded to the etching resist layer 204 in the line direction of the main pattern 14 of the imprint mold 11 (direction indicated by the arrow mark A in FIG. 24B, and also the line direction of the measurement pattern 17 of the imprint mold 11). Thereby deformation of the main pattern 14 and the measurement pattern 17 of the imprint mold 11 can be suppressed.

The pressure by the roller 271 can be appropriately set within a range where the relief structure, constituted by the main pattern 14 and the measurement pattern 17 of the imprint mold 11, can be completely buried in the etching resist layer 204. Therefore, for instance, if the distance from a stage (not illustrated) that transports the transparent substrate 202 to the roller 271 is fixed to a desired value, and the relief structure of the imprint mold 11 is completely buried in the etching resist layer 204 when the transparent substrate 202 and the imprint mold 11 pass between the stage and the roller 271, there is no need to press the imprint mold by applying force to the roller 271 in the direction toward transparent substrate 202.

<Hardening Step>

Then the etching resist layer 204 pressure-bonded with the imprint mold 11 is hardened, whereby the resist pattern layer 205, in which the relief structure constituted by the main pattern 14 and the measurement pattern 17 of the imprint mold 11 is transferred, is formed.

In the example illustrated in FIG. 24B, light is irradiated from the light irradiation apparatus 281 via the imprint mold 11 immediately after the etching resist layer 204 is pressure-bonded with the imprint mold 11, whereby the etching resist layer 204 is hardened, but the etching resist layer 204 may be hardened after the pressure-bonding of the imprint mold 11 and the etching resist layer 204 is completed.

<Separating Step>

Figure 24C:
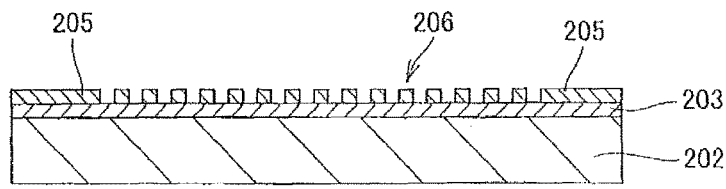

Then the resist pattern layer 205 and the imprint mold 11 are separated, whereby the resist pattern layer 205 is disposed on the wire grid material layer 203 (FIG. 24C). FIG. 24C is a longitudinal sectional view in a direction orthogonal to the transporting direction of the transparent substrate 202 (direction indicated by the arrow mark a), illustrated in FIG. 24B, and the resist pattern layer 205 includes the main pattern 206 and the measurement mark (not illustrated). In FIG. 24C, the residual film (resist layer remaining between the convex portions) in the resist pattern layer 205 is omitted.

The resist pattern layer 205 and the imprint mold 11 are separated in the line direction of the main pattern 14 of the imprint mold 11 (that is, the line direction of the measurement pattern 17 of the imprint mold 11), just like the above-mentioned pressure-bonding step. Then the generation of the pattern defects in the formed resist pattern layer 205, due to deformation or damage of the main pattern 206 and the measurement mark (not illustrated), can be suppressed.

The resist pattern layer 205 and the imprint mold 11 can be separated after the pressure-bonding of the imprint mold 11 to the etching resist layer 204, and formation of the resist pattern layer 205 by hardening the etching resist layer 204 is completed. Further, even before the pressure-bonding of the imprint mold 11 to the etching resist layer 204 is completed, the imprint mold 11 may be appropriately separated from the resist pattern layer 205, which is formed by hardening of the etching resist layer 204 after the pressure-bonding.

<Etching Step>

Figure 24D:
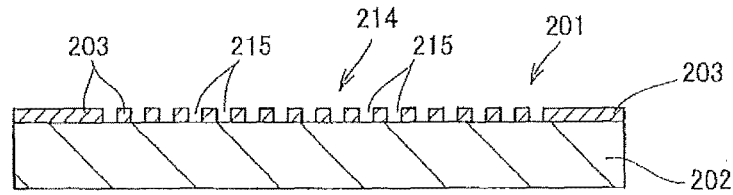

Then a residual film (not illustrated) is removed from the main pattern 206 and the measurement mark (not illustrated) of the resist pattern layer 205 formed as described above, then the wire grid material layer 203 is etched using the resist pattern layer 205 as a mask, whereby the wire grid 214 constituted by the main openings 215 and the measurement pattern (not illustrated) constituted by the unit openings are formed (FIG. 24D). As a result, the wire grid polarizer 201 of the present invention can be manufactured. Just like FIG. 24C, FIG. 24D is also a longitudinal sectional view of the transparent substrate 202 illustrated in FIG. 24B in a direction orthogonal to the transporting direction (direction indicated by the arrow mark a), where the main openings 215 formed on the wire grid material layer 203 are illustrated, but the unit openings are omitted.

The method for manufacturing the wire grid polarizer of the present invention uses the imprint mold of the present invention, and uses the roller imprint according to the imprint method of the present invention, and can suppress deformation of the pattern when the imprint mold and the etching resist layer are pressure-bonded, and can suppress deformation of the pattern to be formed when the resist pattern layer and the imprint mold are separated, whereby the pattern can be formed at high precision. Therefore, in the manufactured wire grid polarizer 201, linearly polarized light can be acquired even in the part where the measurement pattern is disposed, and the difference between the extinction ratio in the wire grid region 213 and the extinction ratio in the measurement pattern region 216 is suppressed, and problems that may occur in photo-alignment processing are prevented. Further, the measurement pattern and the wire grid are close to each other, and the position, direction and the like of the wire grid can be accurately measured by measuring the measurement pattern, and an effective polarization region of the wire grid polarizer can be set wide. Thereby a plurality of wire grid polarizers can be aligned at high precision using the measurement pattern, and a good photo-alignment processing with suppressing the shift of the polarizing axes can be performed.

The above-mentioned embodiment of the method for manufacturing the wire grid polarizer is an example, and the present invention is not limited to this embodiment.

INDUSTRIAL APPLICABILITY

The present invention can be applied, for example, to manufacturing various pattern structures using roller imprint, fine processing of a work piece, such as a substrate, and photo-alignment processing.

REFERENCE SIGNS LIST 11, 11', 21, 31 imprint mold
12, 22, 32 substrate
13, 23, 33 main pattern region
14, 24, 34 main pattern
15, 25, 35 main convex pattern
16, 26, 36 measurement pattern region
17, 27, 37, 47, 57 measurement pattern
18a, 18b, 28a, 28b, 38a, 38b, 48a, 48b, 58a, 58b unit convex pattern
101 transfer substrate
103 molding resin layer
104 transfer resin layer
151 roller
201, 201', 221, 241 wire grid polarizer
202, 222, 242 transparent substrate
203, 223, 243 wire grid material layer
213, 233, 253 wire grid region
213a, 233a, 253a contour line of wire grid region
214, 234, 254 wire grid
215, 235, 255 main opening
216, 236, 256 measurement pattern region
217, 237, 257 measurement pattern
218a, 218b, 238a, 238b, 258a, 258b unit opening
204 etching resist layer
205 resist pattern layer
271 roller

The invention claimed is:
1. An imprint mold, comprising:
a substrate having flexibility; and
a main pattern region and a measurement pattern region which are set on one surface of the substrate, wherein
a main pattern, in which a plurality of line-shaped main convex patterns or main concave patterns are arrayed with predetermined intervals, is disposed in the main pattern region,
a measurement pattern, in which a plurality of line-shaped unit convex patterns or unit concave patterns are arrayed with predetermined intervals, is disposed in the measurement pattern region, and
a line direction of the main pattern and the line direction of the measurement pattern are the same,
the main pattern region has a rectangular contour and each side of the rectangle has a concave region, and
the measurement pattern region is disposed in each of the concave regions.

2. The imprint mold according to claim 1, wherein
a line width of the line-shaped main convex pattern or main concave pattern constituting the main pattern and a line width of the line-shaped unit convex pattern or unit concave pattern constituting the measurement pattern are the same.

3. A method for manufacturing a wire grid polarizer, comprising:
a pressure-bonding step of bonding a surface on one side of a flexible imprint mold, the surface being provided with a relief structure, to an etching resist layer disposed on a wire grid material layer of a transparent substrate, which has the wire grid material layer on one surface thereof, by pressing from a surface of the imprint mold, on which the relief structure is not formed, using a roller;
a hardening step of forming a resist pattern layer, to which the relief structure is transferred, by hardening the etching resist layer that is pressure-bonded to the imprint mold;
a separating step of separating the resist pattern layer and the imprint mold; and
an etching step of forming line-shaped main openings constituting a wire grid and line-shaped unit openings constituting a measurement pattern by etching the wire grid material layer using the resist pattern layer as an etching mask, wherein
as the imprint mold, the imprint mold according to claim 2 is used, and
the imprint mold is pressure-bonded to the etching resist layer in the line direction of the main pattern of the imprint mold in the pressure-bonding step, and the resist pattern layer and the imprint mold are separated in the line direction of the main pattern of the imprint mold in the separating step.

4. The imprint mold according to claim 1, wherein
the measurement pattern includes a part that can be observed by an observing unit.

5. The imprint mold according to claim 1, wherein
the distance between the main pattern region and the measurement pattern region is 100 µm or less.

6. The imprint mold according to claim 1, wherein
a positional shift between the center line of the line-shaped unit convex pattern or unit concave pattern constituting the measurement pattern and the center line of the line-shaped main convex pattern or main concave pattern constituting the main pattern disposed on extension of the center line of the line-shaped unit convex pattern or unit concave pattern constituting the measurement pattern is less than half of the line width of the line-shaped unit convex pattern or unit concave pattern constituting the measurement pattern.

7. The imprint mold according to claim 1, wherein
the substrate is a resin film.

8. An imprint method, comprising:
a pressure bonding step of bonding a surface on one side of a flexible imprint mold, the surface being provided with a relief structure, to a molding resin layer disposed on one surface of a transfer substrate, by pressuring from a surface of the imprint mold, on which the relief structure is not formed, using a roller;
a hardening step of forming a transferred resin layer, to which the relief structure is transferred, by hardening the molding resin layer that is pressure-bonded to the imprint mold; and a separating step of disposing a pattern structure, which is the transferred resin layer, onto the transfer substrate, by separating the transferred resin layer and the imprint mold, wherein as the imprint mold, the imprint mold according to claim 1 is used, and the imprint mold is pressure-bonded to the molding resin layer by rotating the roller along the line direction of the main pattern of the imprint mold in the pressure bonding step.

9. The imprint method according to claim 8, wherein the transferred resin layer and the imprint mold are separated in the line direction of the main pattern of the imprint mold in the separating step.

10. A wire grid polarizer, comprising:
a transparent substrate;
a wire grid material layer which is disposed on one surface of the transparent substrate; and
a wire grid region and a measurement pattern region which are set on the wire grid material layer, wherein
a wire grid, in which a plurality of line-shaped main openings are arrayed with predetermined intervals, is disposed in the wire grid region of the wire grid material layer,
a measurement pattern, in which a plurality of line-shaped unit openings are arrayed with predetermined intervals, is disposed in the measurement pattern region of the wire grid material layer, and
a line direction of each of the main openings and a line direction of each of the unit openings are the same, and a line width of the main opening and a line width of the unit opening are the same.

11. The wire grid polarizer according to claim 10, wherein the measurement pattern region has at least a region disposed inside the contour line of the wire grid region.

12. The wire grid polarizer according to claim 10, wherein the measurement pattern includes a part that can be observed by an observing unit.

13. The wire grid polarizer according to claim 10, wherein the distance between the wire grid region and the measurement pattern region is 100 μm or less.

14. The wire grid polarizer according to claim 10, wherein the positional shift between the center line of each the unit openings and the center line of each of the main openings disposed on extension of the center line of each of the unit openings is less than half of the line width of each of the unit openings.

* * * * *